(12) United States Patent
Yoon et al.

(10) Patent No.: US 7,579,648 B2
(45) Date of Patent: Aug. 25, 2009

(54) SEMICONDUCTOR DEVICE HAVING A CHANNEL PATTERN AND METHOD OF MANUFACTURING THE SAME

(75) Inventors: Jae-Man Yoon, Seoul (KR); Dong-Gun Park, Seongnam-si (KR); Choong-Ho Lee, Seongnam-si (KR); Chul Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 340 days.

(21) Appl. No.: 11/183,997

(22) Filed: Jul. 19, 2005

(65) Prior Publication Data

US 2006/0017104 A1 Jan. 26, 2006

(30) Foreign Application Priority Data

Jul. 22, 2004 (KR) .................. 10-2004-0057101

(51) Int. Cl.
*H01L 27/108* (2006.01)
(52) U.S. Cl. .................. 257/329; 257/302; 438/268
(58) Field of Classification Search ............. 257/213, 257/288, 401, 382, 383, 412, 329; 438/268
See application file for complete search history.

(56) References Cited

U.S. PATENT DOCUMENTS

| | | | |
|---|---|---|---|
| 4,996,574 A | 2/1991 | Shirasaki | |
| 5,140,388 A * | 8/1992 | Bartelink | 257/369 |
| 5,497,019 A | 3/1996 | Mayer et al. | |
| 5,561,308 A * | 10/1996 | Kamata et al. | 257/301 |
| 6,051,487 A * | 4/2000 | Gardner et al. | 438/585 |
| 6,150,688 A * | 11/2000 | Maeda et al. | 257/302 |
| 6,413,802 B1 | 7/2002 | Hu et al. | |
| 6,664,143 B2 * | 12/2003 | Zhang | 438/138 |
| 6,885,041 B2 * | 4/2005 | Awano | 257/192 |
| 7,053,447 B2 * | 5/2006 | Verhoeven | 257/324 |
| 2007/0018206 A1 * | 1/2007 | Forbes | 257/288 |

FOREIGN PATENT DOCUMENTS

| KR | 0155840 | 7/1998 |
|---|---|---|
| KR | 10-0406578 | 11/2003 |
| KR | 10-0422412 | 2/2004 |

* cited by examiner

*Primary Examiner*—Zandra Smith
*Assistant Examiner*—Paul E Patton
(74) *Attorney, Agent, or Firm*—Harness, Dickey & Pierce, P.L.C.

(57) ABSTRACT

A semiconductor device may include a tubular channel pattern vertically extending from a semiconductor substrate. A gate insulation layer may be provided on faces exposed through the channel pattern. A gate electrode may be provided on the gate insulation layer. The gate electrode may fill the channel pattern. A conductive region, which may serve as lower source/drain regions, may be formed at a surface portion of the semiconductor substrate. The conductive region may contact a lower portion of the channel pattern. A conductive pattern, which may serve as upper source/drain regions, may horizontally extend from an upper portion of the channel pattern.

28 Claims, 22 Drawing Sheets

FIRST HORIZONTAL DIRECTION

SECOND HORIZONTAL DIRECTION

SEMICONDUCTOR DEVICE HAVING A CHANNEL PATTERN AND METHOD OF MANUFACTURING THE SAME

PRIORITY STATEMENT

This application claims benefit of priority under 35 USC § 119 from Korean Patent Application No. 2004-57101 filed on Jul. 22, 2004, the content of which is incorporated herein by reference in its entirety.

BACKGROUND

1. Field of the Invention

Example, non-limiting embodiments of the present invention relate generally to a semiconductor device and a method of manufacturing the same. More particularly, example, non-limiting embodiments of the present invention relate to a semiconductor device having an active pattern that extends from a semiconductor substrate and a method of manufacturing the same.

2. Description of the Related Art

A semiconductor device may be highly integrated so that an area of an active region may be reduced. Accordingly, a channel length of a metal-oxide semiconductor (MOS) transistor, for example, formed on the active region may also be reduced. When the channel length of the MOS transistor is reduced, source/drain regions may have an influence on an electric field and/or a voltage in a channel region. This phenomenon may be referred to as a short channel effect. In addition, a channel width may be reduced proportionally to the reduction of the active region so that a threshold voltage may be increased. This phenomenon may be referred to as a narrow channel effect or a narrow width effect.

A semiconductor device having both a reduced size and an improved capacity has been the subject of development. According to such development, the semiconductor may include a vertical transistor structure such as a fin structure, a fully depleted lean-channel transistor (DELTA) structure and a gate-all-around (GAA) structure.

For example, a fin type MOS transistor may include thin channel fins in parallel with each other. The thin channel fins may be positioned between source/drain regions. The fin typed MOS transistor may also include a gate electrode formed on both side faces of the channel fin. In the fin type MOS transistor, the gate electrode may be controlled by selectively providing a current to the side faces of the channel fin, thereby suppressing the short channel effect. However, the channel fins of the fin typed MOS transistor may be parallel to each other in a width direction of the gate electrode, and therefore a channel region and the source/drain regions may occupy a substantial area of the fin type MOS transistor. Also, the number of channels may be increased, and therefore a junction capacitance between the source/drain regions may be increased.

A MOS transistor having a DELTA structure may include an active layer that may include a vertically protruded portion that may serve as a channel layer. A gate electrode may enclose the protruded portion of the active layer. A height of the protruded portion of the active layer may correspond to a width of the channel layer. A width of the protruded portion of the active layer may correspond to a thickness of the channel layer. Both side faces of the protruded portion of the active layer may be available as channel layers, and therefore the channel may have an increased width, thereby preventing the narrow channel effect. In addition, when a width of the protruded portion is decreased, depletion layers of the channel layer that are formed on both of the side faces of the protruded portion may be overlapped so that the channel layer may have an increased electric conductivity.

However, in order to form the MOS transistor having the DELTA structure on a bulk silicon substrate, the bulk silicon substrate may be etched to form a vertical protrusion where the channel layer may be formed. The vertical protrusion may be covered with an oxidation-preventing layer. An oxidation process may be performed on the silicon substrate having the vertical protrusion. When the oxidation process is excessively performed, an interface between the protrusion and a portion of the silicon substrate that is not covered with the oxidation-preventing layer may be oxidized by lateral diffusion of oxygen, so that the vertical protrusion may be separated from the silicon substrate. When the vertical protrusion is separated from the substrate body, the channel layer may have a narrow width. Also, a single crystalline layer in the vertical protrusion may be damaged by stresses generated in the oxidation process.

The MOS transistor having the DELTA structure may be formed using a silicon-on-insulator (SOI) substrate. Here, an SOI layer may be etched to form a channel region having a narrow width. Thus, problems caused by the excessive oxidation of the bulk silicon substrate may be reduced. However, a width of the channel may be limited by a thickness of the SOI layer. For example, because a fully depleted type SOI substrate has a thickness of about 100 Å to 900 Å, a width of the channel may be limited.

A MOS transistor having a GAA structure may have an active region formed using an SOI layer. A gate electrode may enclose a channel region formed in an active region, which may be covered with a gate insulation layer. Thus, excessive oxidation of the bulk silicon substrate may be reduced.

However, in order to enclose the active pattern where the channel region is formed therein with a gate electrode, a buried oxidation layer positioned beneath the active pattern may be partially removed using an undercut effect of an isotropic etching process, for example. Here, since the SOI layer may be used for the channel region and source/drain regions, a lower portion of the source/drain regions as well as a lower portion of the channel region may be partially removed in the isotropic etching process. When a conductive layer such as the gate electrode is formed, the conductive layer may be formed on the lower portion of the source/drain regions as well as on the channel region. As a result, a parasitic capacitance may be increased.

In addition, a lower portion of the channel region may be horizontally etched in the isotropic etching process. A horizontal length and/or a width of a tunnel to be filled with the gate electrode may be increased. As a result, it may be difficult to manufacture a MOS transistor having a gate length that may be shorter than a channel length. In addition, there may be a limitation in reducing the gate length.

SUMMARY

According to an example, non-limiting embodiment of the present invention, a semiconductor device may include a tubular channel pattern vertically extending from a substrate. A gate insulation layer may be provided on an inner sidewall of the channel pattern and a portion of the substrate exposed through the channel pattern. A gate electrode may be provided on the gate insulation layer. A conductive region may be provided at a surface portion of the substrate. The conductive region may contact the channel pattern. A conductive pattern may be vertically spaced apart from the conductive region. The conductive pattern may horizontally extend from the channel pattern.

According to another example, non-limiting embodiment of the present invention, a method may involve forming a tubular channel pattern that may vertically extend from a substrate. A conductive region may be formed at a surface portion of the substrate. The conductive region may contact the channel pattern. A conductive pattern may be formed vertically spaced apart from the conductive region. The conductive pattern may horizontally extend from the channel pattern. A gate insulation layer may be formed on an inner sidewall of the channel pattern and a portion of the substrate exposed through the channel pattern. A gate electrode may be formed on the gate insulation layer.

According to another example, non-limiting embodiment of the present invention, a semiconductor device may include a channel pattern that may vertically extend from a semiconductor substrate. A gate insulation layer may be provided on a sidewall of the channel pattern and the semiconductor substrate. A gate electrode may be provided on the gate insulation layer. A conductive region may be provided at a surface portion of the substrate. The conductive region may contact the channel pattern. A conductive pattern may be vertically spaced apart from the conductive region. The conductive pattern may horizontally extend from the channel pattern.

According to another example, non-limiting embodiment of the present invention,

BRIEF DESCRIPTION OF THE DRAWINGS

Example, non-limiting embodiments of the invention will be apparent by reference to the following detailed description thereof, when considered in conjunction with the accompanying drawings, wherein like reference numerals designate like structural elements.

DESCRIPTION OF EXAMPLE, NON-LIMITING EMBODIMENTS

Figure 1:
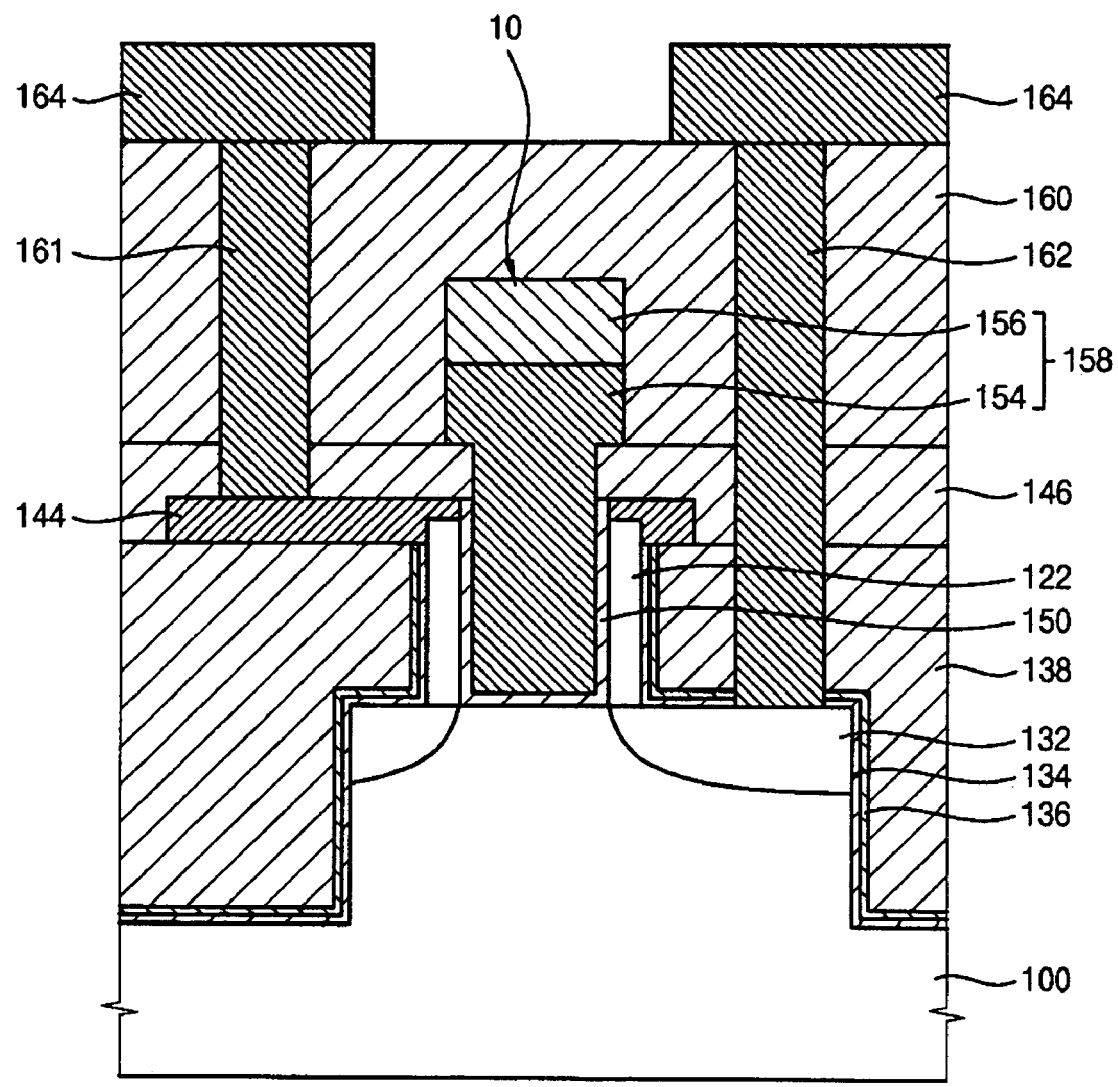
FIG. 1 is a cross-sectional view illustrating a semiconductor device in accordance with an example, non-limiting embodiment of the present invention.

Example, non-limiting embodiments of the present invention will be described with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention. In the drawings, the size and relative sizes of layers and regions may be exaggerated for clarity. The drawings are not to scale.

It will be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used to describe an element and/or feature's relationship to another element(s) and/or feature(s) as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Figure 2:
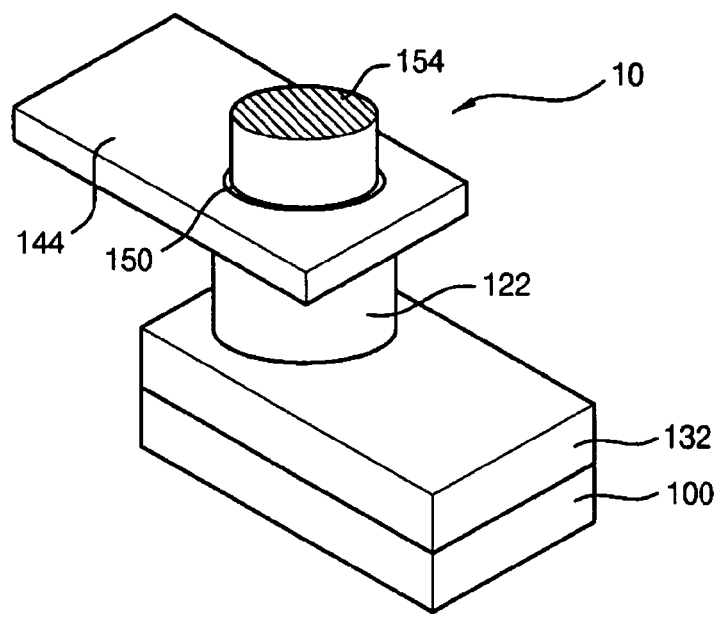
FIG. 2 is a perspective view illustrating the semiconductor device shown in FIG. 1.

FIG. 1 is a cross-sectional view illustrating a semiconductor device in accordance with an example, non-limiting embodiment of the present invention, and FIG. 2 is a perspective view illustrating the semiconductor device shown in FIG. 1.

Referring to FIGS. 1 and 2, a semiconductor device 10 such as a MOS transistor, for example, may be positioned on a semiconductor substrate 100 such as a silicon wafer, for example. The semiconductor device 10 may include a gate electrode 154, a gate insulation layer 150, a channel pattern 122, a conductive region 132, and a conductive pattern 144.

The channel pattern 122 may have tubular shape. The channel pattern 122 may vertically extend from the semiconductor substrate 100. In this example embodiment, the channel pattern 122 may have a circular cross sectional shape. In alternative embodiments, the channel pattern 122 may have any other geometric cross sectional shape. For example, the channel pattern 122 may have a polygonal cross sectional shape, such as a quadrilateral cross sectional shape. The channel pattern 122 may be formed by etching (for example) the semiconductor substrate 100.

The gate insulation layer 150 may be positioned on inward facing surfaces of the channel pattern 122. In particular, the gate insulation layer 150 may be positioned on an inner face of the channel pattern 122 and a portion of the semiconductor substrate 100 that may be exposed through the channel pattern 122. The gate insulation layer 150 may be fabricated from silicon oxide, silicon oxynitride, hafnium oxide (HfO2), zirconium oxide (ZrO2), lanthanum oxide (La2O3), tantalum oxide (Ta2O5), titanium oxide (Ti2O), strontium titanate (SrTiO3), and barium strontium titanate ((Ba,Sr)TiO3), for example. These materials may be used alone or in combination.

The gate electrode 154 may be positioned on the gate insulation layer 150. The gate electrode 154 may fill the channel pattern 122. In this example embodiment, the gate electrode 154 may have a cylindrical shape. The gate electrode 154 may be fabricated from a metal or polysilicon doped with impurities, for example. These materials may be used alone or in combination. The gate electrode 154 may have a shape corresponding to that of the channel pattern 122. An upper end of the gate electrode 154 may protrude from the channel pattern 122. The gate electrode 154 may extend through a first insulating interlayer 146 and into a second insulating interlayer 160. The first insulating interlayer 146 may be formed on the conductive pattern 144 and the second insulating interlayer 160 may be formed on the first insulating interlayer 146. A capping pattern 156 may be positioned on the gate electrode 154. The gate electrode 154 and the capping pattern 156 may together form a gate structure 158.

The conductive region 132 may be formed on the semiconductor substrate 100. The conductive region 132 may contact the channel pattern 122. The conductive region 132 may serve as lower source/drain regions of the semiconductor device 10.

The conductive pattern 144 may be vertically spaced apart from the conductive region 132. The conductive pattern 144 may vertically extend from the channel pattern 122. In particular, the conductive pattern 144 may extend from an upper portion of the channel pattern 122 in a direction away from the conductive region 132. The conductive pattern 144 may be fabricated from a metal or polysilicon doped with impurities, for example. These materials may be used alone or in a combination. The conductive pattern 144 may enclose the upper portion of the channel pattern 122. The conductive pattern 144 may serve as upper source/drain regions of the semiconductor device 10.

The gate insulation layer 150 may protrude from the channel pattern 122. The conductive pattern 144 may enclose an upper portion of the gate insulation layer 150 and an upper portion of the channel pattern 122. The conductive pattern 144 and the conductive region 132 may extend from the channel pattern 122 in substantially opposite directions. For example, as shown in FIG. 1, the conductive pattern 144 may extend horizontally to the left from the channel pattern 122, and the conductive region 132 may extend horizontally to the right from the channel pattern 122. In alternative embodiments, the conductive pattern 144 may extend only from an upper side face of the channel pattern 122 (and not from the gate insulation layer 150). The conductive pattern 144 and the conductive region 132 may be electrically connected to metal wirings 164 on the second insulating interlayer 160 via a first contact plug 161 and a second contact plug 162.

An oxide layer 134 may be provided on the substrate 100. A nitride layer 136 may be provided on the oxide layer 134. A field insulation layer 138 may be provided on the nitride layer 136. The oxide layer 134, the nitride layer 136 and the field insulation layer 138 will be discussed in more detail below.

The semiconductor device 10 may be positioned on a bulk silicon wafer. Alternatively, the semiconductor device 10 may be positioned on an SOI substrate.

Figure 31:
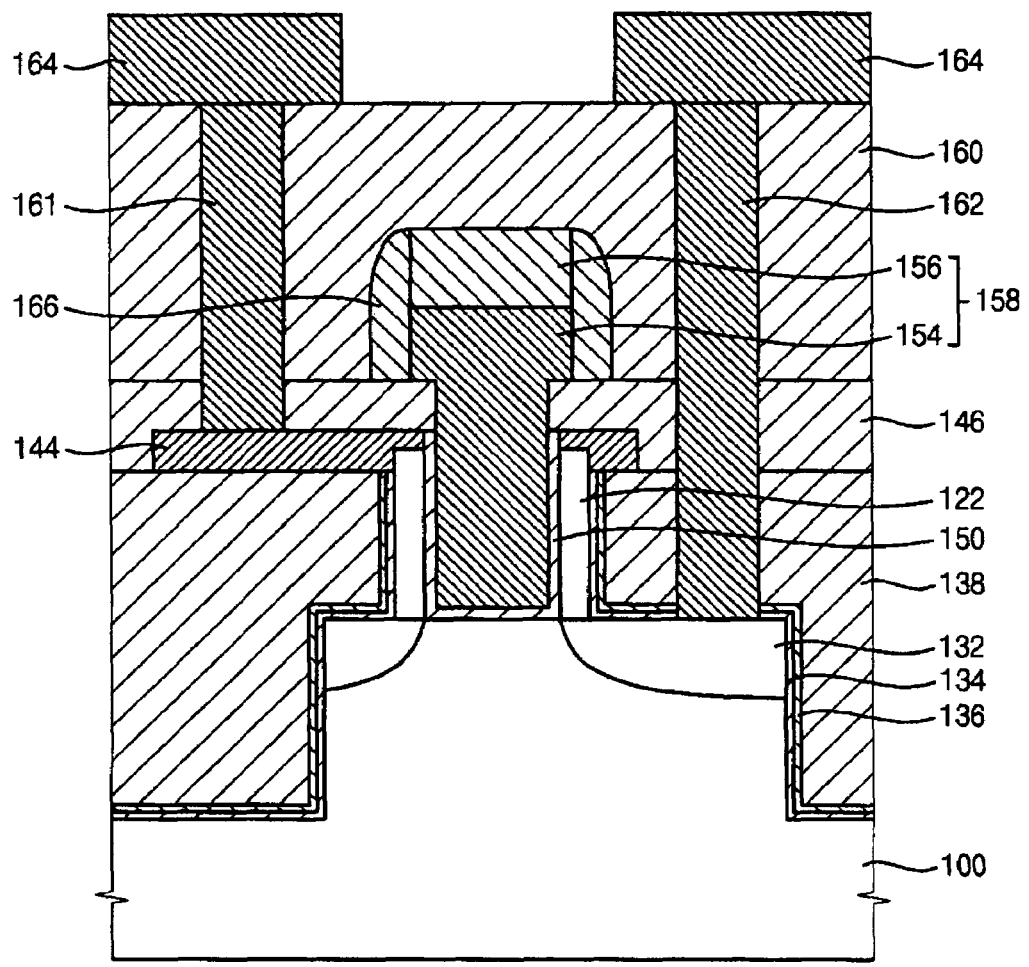
Figure 32:
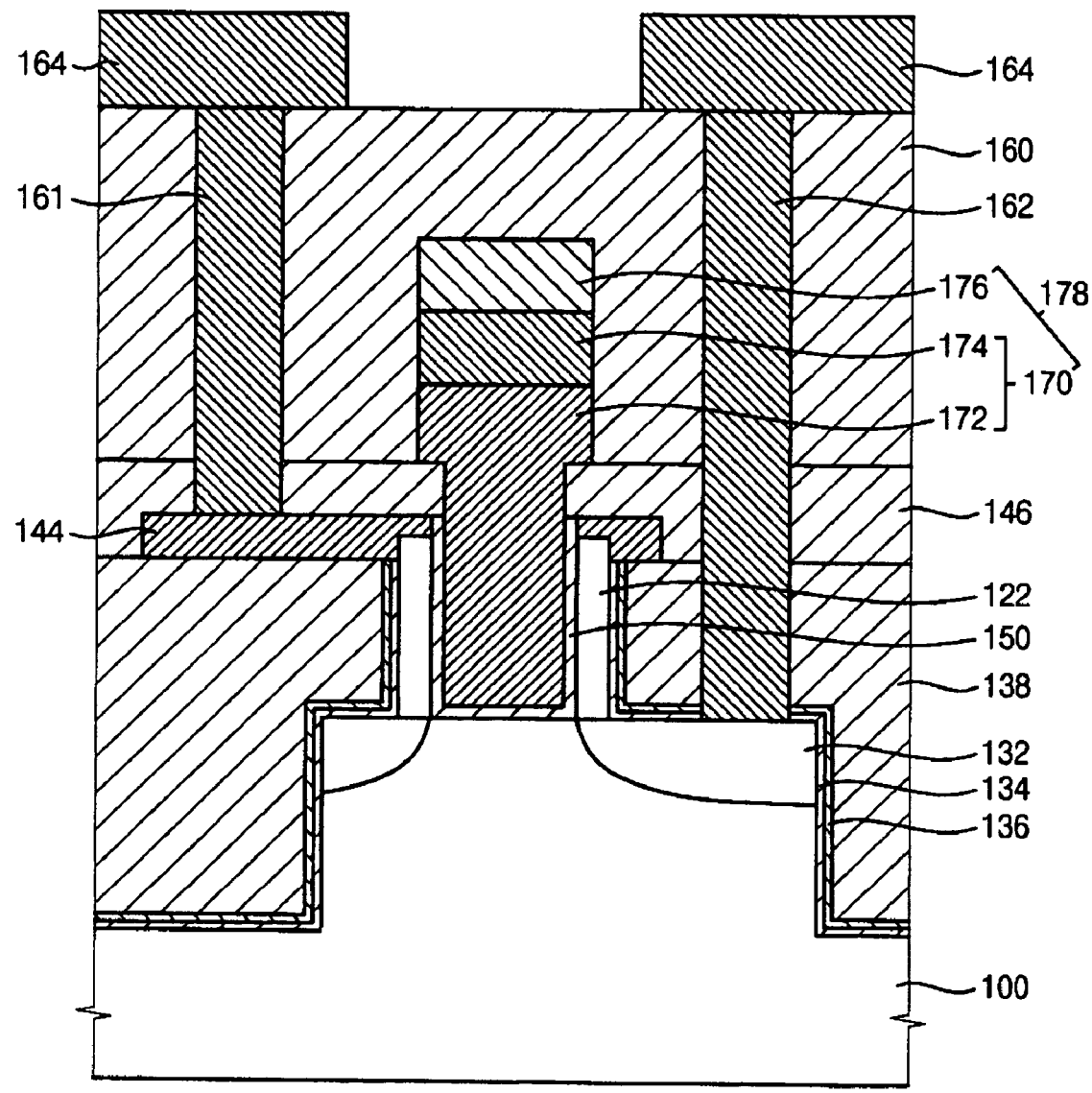
Figure 36:
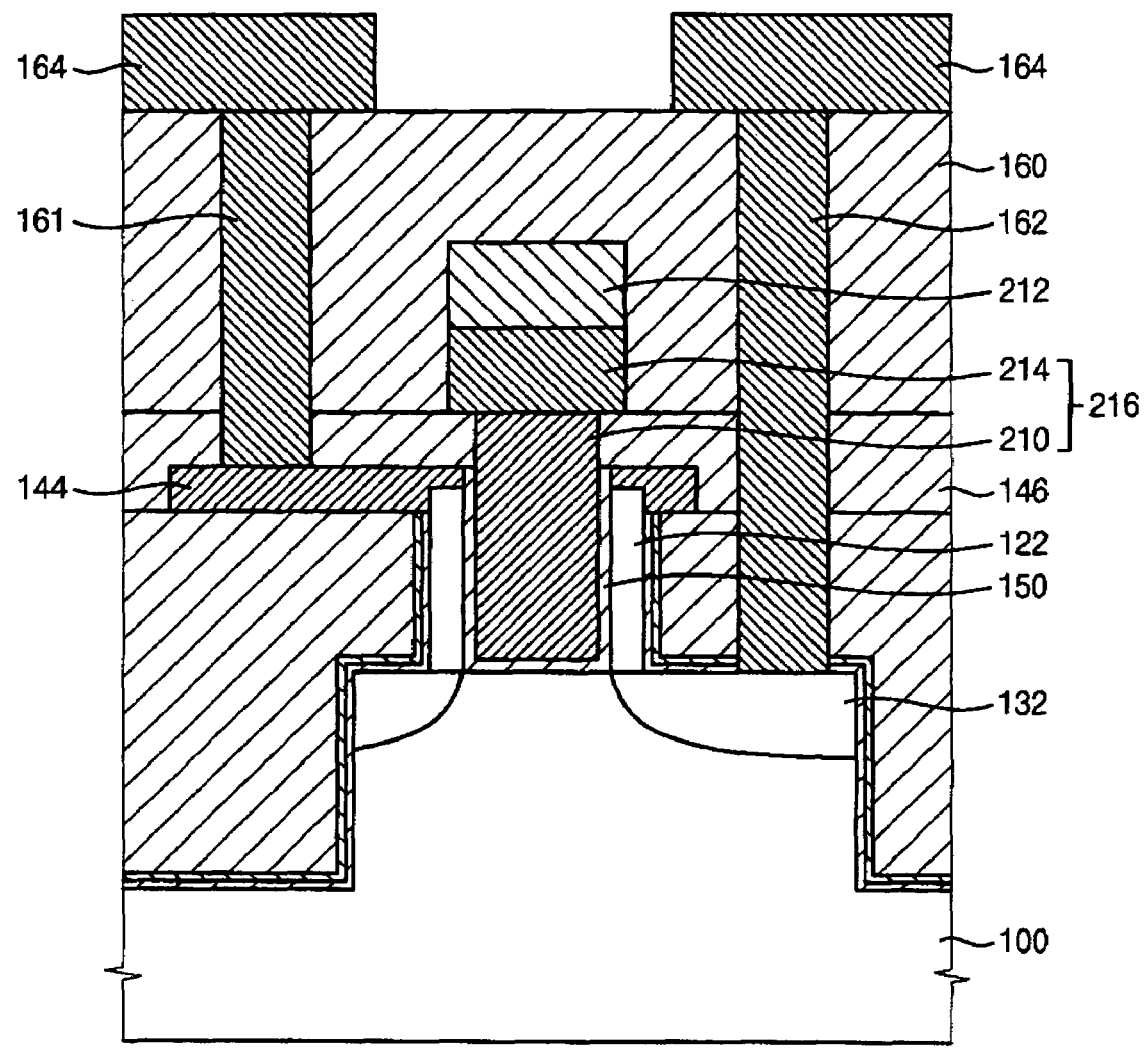

In alternative embodiments, various and alternative gate structures may be suitably implemented. For example, as illustrated in FIG. 31, spacers 166 may be positioned on a sidewall of a gate structure 158 including the gate electrode 154 and the capping pattern 156. As illustrated in FIG. 32, a gate electrode 170 may include a polysilicon pattern 172 and a metal silicide pattern 174. As illustrated in FIG. 36, a gate electrode 216 may include a polysilicon plug 210 and a metal pattern 214.

In the semiconductor device 10 of the example embodiment, a channel length may be defined by a height of the channel pattern 122 and a channel width may be defined by a diameter of the channel pattern 122. Thus, the channel length and the channel width may be adjusted to suppress a short channel effect and a narrow channel effect.

Figure 3:
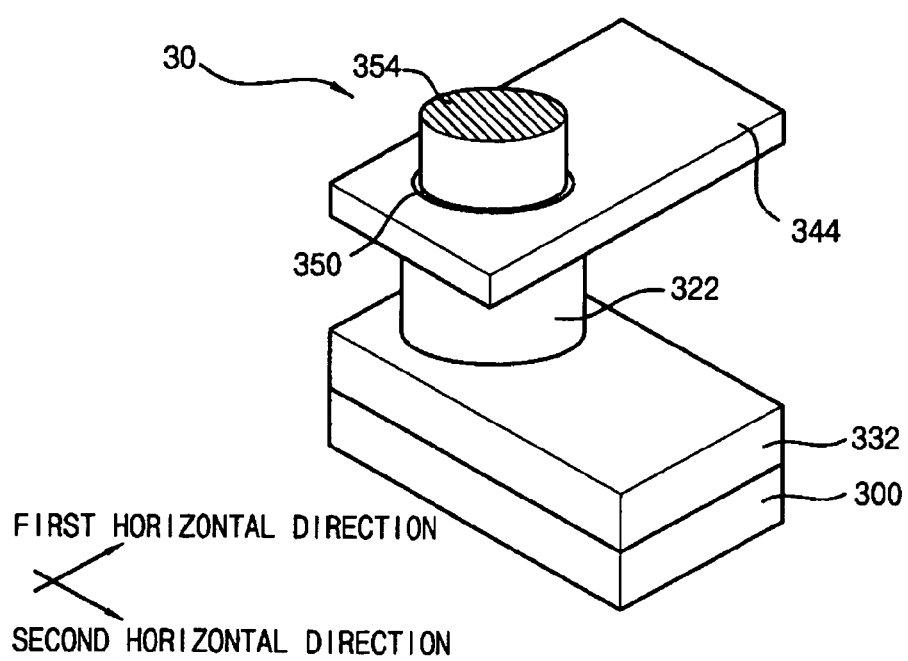
FIG. 3 is a perspective view illustrating a semiconductor device in accordance with another example, non-limiting embodiment of the present invention.

FIG. 3 is a perspective view of a semiconductor device in accordance with another example, non-limiting embodiment of the present invention.

Referring to FIG. 3, a semiconductor device 30 may include a channel pattern 322, a gate electrode 354, a gate insulation layer 350, a conductive region 332, and a conductive pattern 344. The channel pattern 322 may have a tubular shape. The channel pattern 322 may vertically extend from a semiconductor substrate 300. The gate electrode 354 may fill the channel pattern 322. The gate electrode 354 may vertically extend from a bottom face of the gate insulation layer 350. The gate insulation layer 350 may be positioned between the channel pattern 322 and the gate electrode 354. The conductive region 332 may be formed on the semiconductor substrate 300. The conductive region 332 may contact the channel pattern 322. The conductive pattern 344 may horizontally extend from an upper portion of the channel pattern 322.

As illustrated in FIG. 3, the conductive pattern 344 and the conductive region 332 may extend from the channel pattern in a first horizontal direction and a second horizontal direction, respectively. An angle between the first horizontal direction and the second horizontal direction may be about 90°, for example. In alternative embodiments, the angle between the first and the second directions may be varied. A layout of a data storing and/or a processing device including the semiconductor device 30 may be improved by varying the angle between the first and the second directions.

Figure 4:
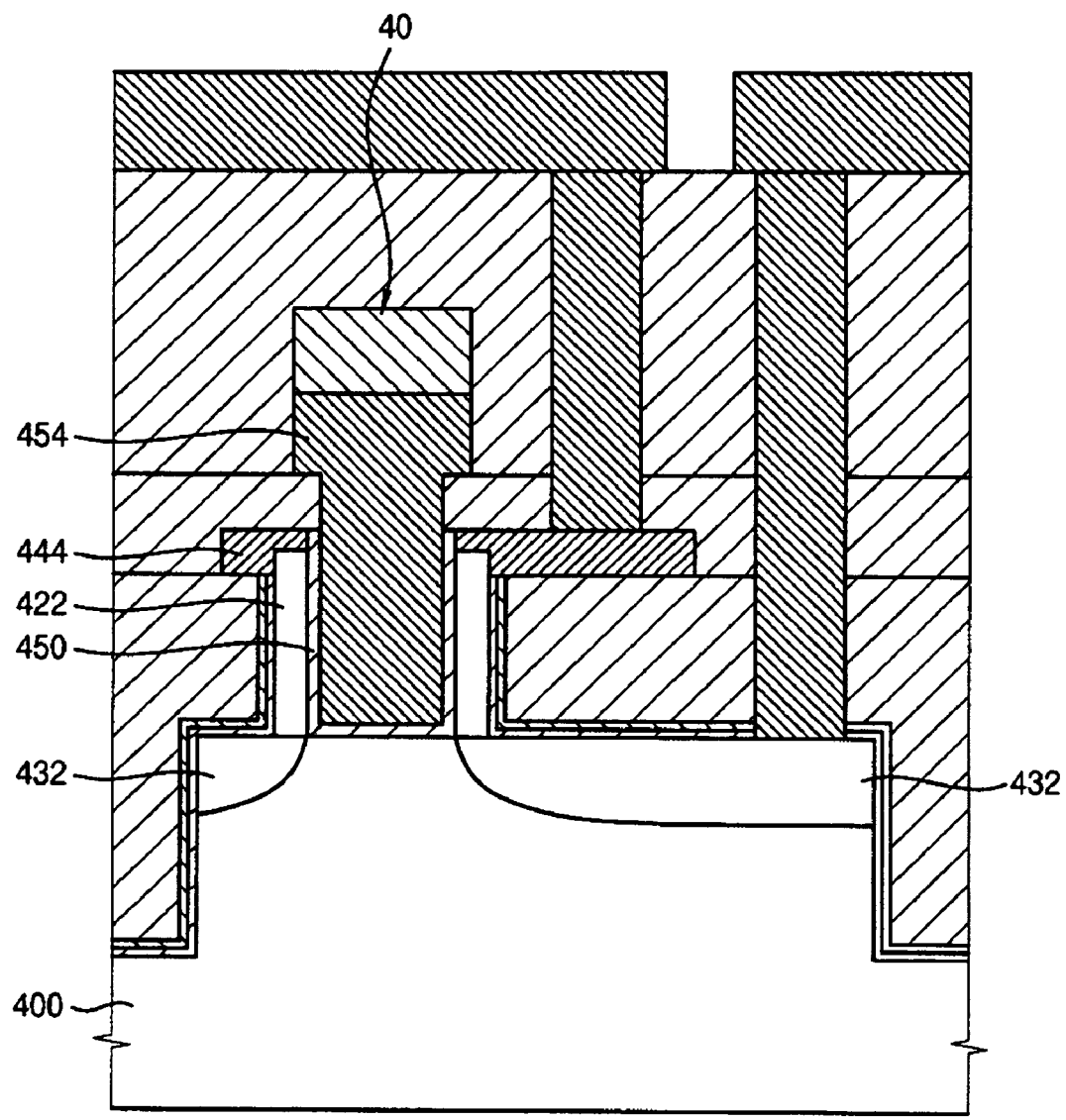
FIG. 4 is a cross-sectional view illustrating a semiconductor device in accordance with another example, non-limiting embodiment of the present invention.
Figure 5:
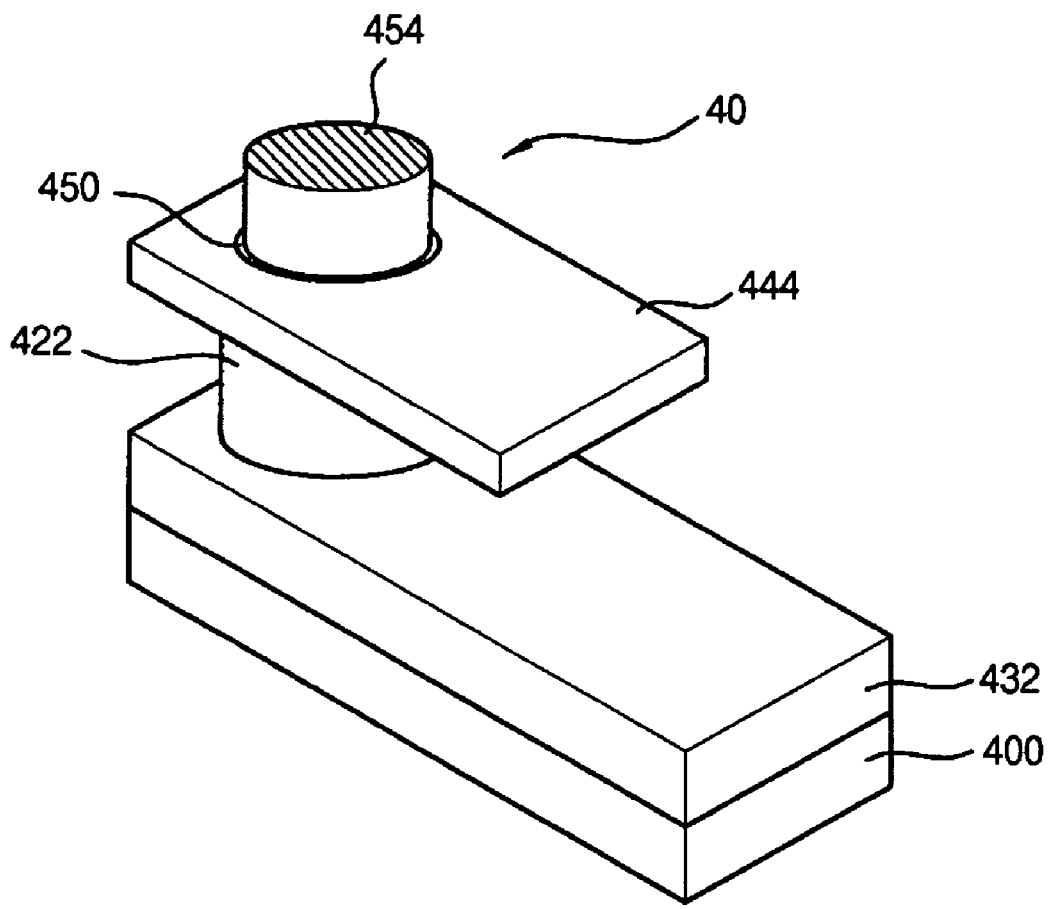
FIG. 5 is a perspective view illustrating the semiconductor device shown in FIG. 4.

FIG. 4 is a cross-sectional view of a semiconductor device in accordance with anther example, non-limiting embodiment of the present invention. FIG. 5 is a perspective view illustrating the semiconductor device shown in FIG. 4.

Referring to FIGS. 4 and 5, a semiconductor device 40 may include a channel pattern 422, a gate electrode 454, a gate insulation layer 450, a conductive region 432, and a conductive pattern 444. The channel pattern 422 may have a tubular shape. The channel pattern 422 may vertically extend from a semiconductor substrate 400. The gate electrode 454 may fill the channel pattern 422. The gate electrode 454 may vertically extend from a bottom face of the gate insulation layer 450. The gate insulation layer 450 may be positioned between the channel pattern 422 and the gate electrode 454. The conductive region 432 may be formed on the semiconductor substrate 400. The conductive region 432 may contact the channel pattern 422. The conductive pattern 444 may horizontally extend from an upper portion of the channel pattern 422.

As illustrated in FIGS. 4 and 5, the conductive pattern 444 and the conductive region 432 may extend from the channel pattern 422 in substantially identical directions. The conductive pattern 444 and the conductive region 432 may be substantially parallel to each other. By way of example only, the conductive region 432 may have a length longer than that of the conductive pattern 444.

A layout of a data storing and/or processing device including the semiconductor device 40 may be improved by modifying the extension directions and the extension lengths of the conductive pattern 444 and the conductive region 432.

FIGS. 6 to 33 are cross-sectional views illustrating an example method that may be implemented to manufacture the semiconductor device shown in FIGS. 1 and 2.

Figure 6:
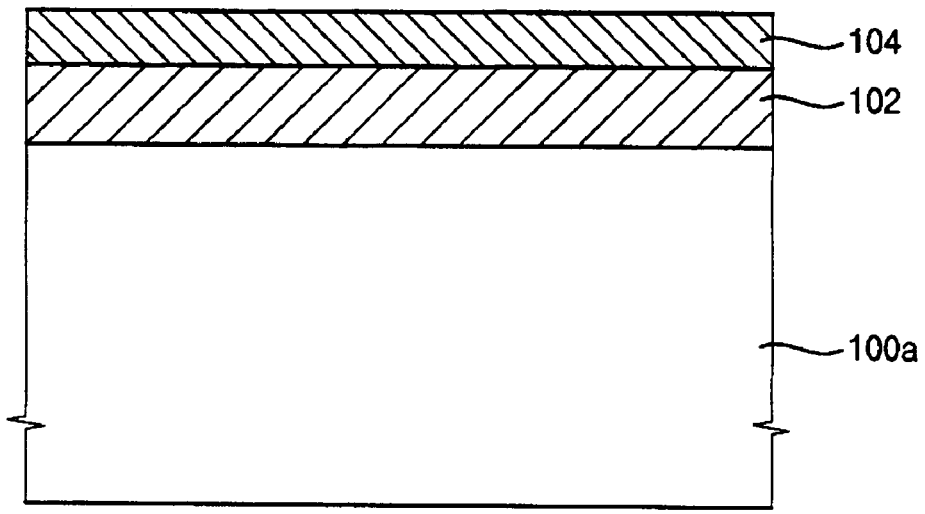
FIGS. 6 to 33 are cross-sectional views illustrating an example, non-limiting method that may be implemented to manufacture the semiconductor device shown in FIGS. 1 and 2.

Referring to FIG. 6, a first sacrificial layer 102 having a thickness of about 500 Å (for example) may be formed on a preliminary semiconductor substrate 100a, such as a silicon wafer (for example). A second sacrificial layer 104 having a thickness of about 300 Å (for example) may be formed on the first sacrificial layer 102. The first sacrificial layer 102 may include silicon oxide, for example. The silicon oxide may include undoped silicate glass (USG), tetraethylorthosilicate (TEOS), high density plasma (HDP) oxide, for example. These materials may be used alone or in combination. The second sacrificial layer 104 may include silicon nitride, for example. The second sacrificial layer 104 may be formed using a dichlorosilane (SiH2Cl2) gas, a silane (SiH4) gas, and/or an ammonia (NH3) gas (for example) in a low pressure chemical vapor deposition (LPCVD) process and/or a plasma enhanced chemical vapor deposition (PECVD) process (for example).

Figure 7:
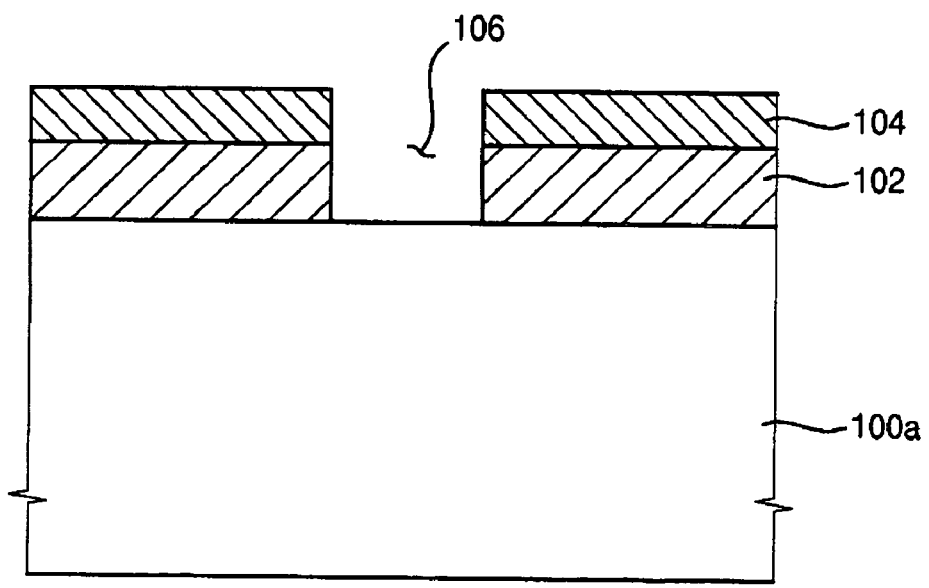

Referring to FIG. 7, the first sacrificial layer 102 and the second sacrificial layer 104 may be patterned to form a first opening 106. The first opening 106 may partially expose the preliminary semiconductor substrate 100a. For example, a first photoresist pattern (not shown) may be formed on the second sacrificial layer 104. The first sacrificial layer 102 and the second sacrificial layer 104 may be anisotropically etched using the first photoresist pattern as an etching mask to form the first opening 106.

Figure 8:
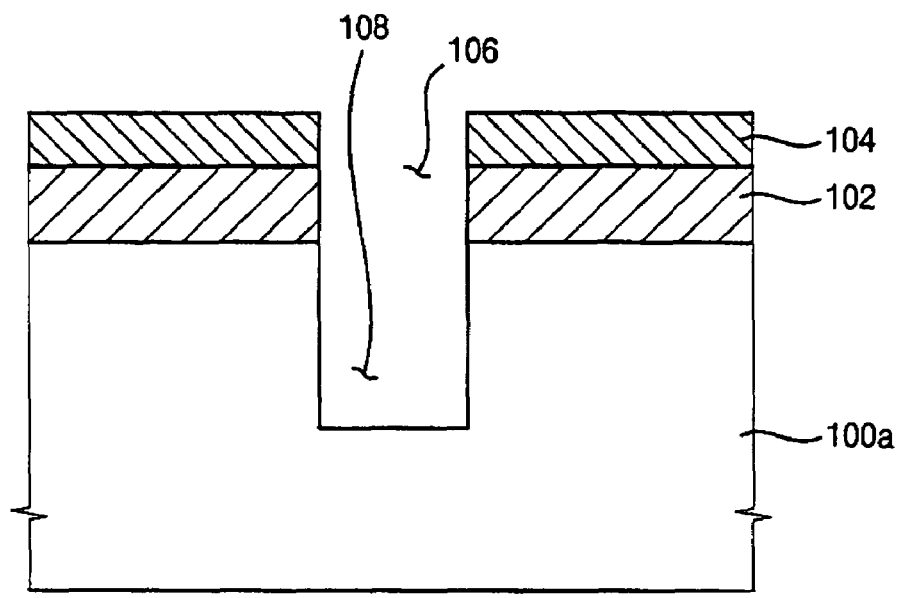

Referring to FIG. 8, a portion of the preliminary semiconductor substrate 100a, which may be exposed through the first opening 106, may be etched to form a second opening 108 in the preliminary semiconductor substrate 100a. For example, the first photoresist pattern may be removed by an ashing process and/or a stripping process (for example). The portion of the preliminary semiconductor substrate 100a, which may be exposed through the first opening 106, may be anisotropically etched using the second sacrificial layer 104 as an etching mask to form the second opening 108. The second opening 108 may have a depth of about 800 Å to about 2,000 Å (for example).

Figure 9:
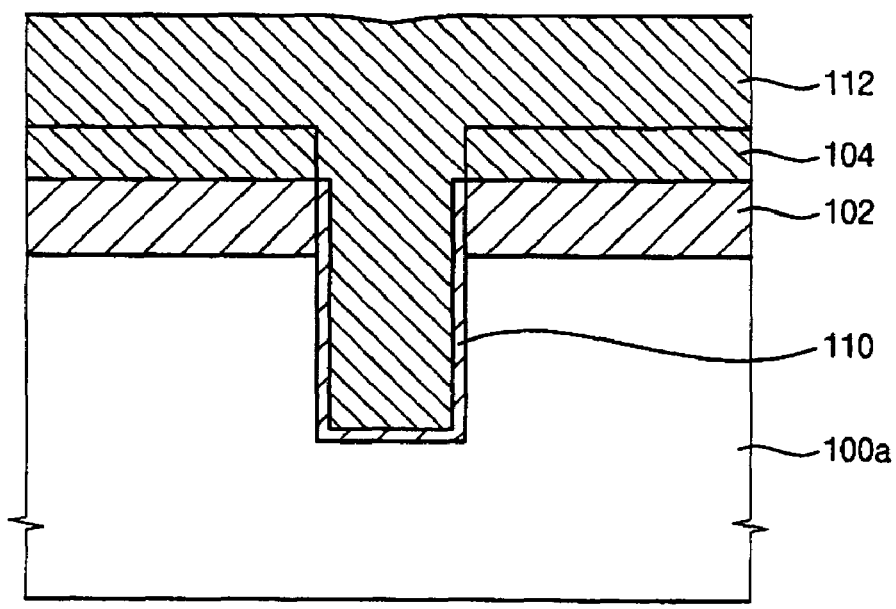

Referring to FIG. 9, a first insulation layer 110 may be formed on an inner face of the second opening 108. A third sacrificial layer 112 may be formed on the first insulation layer 110 and the second sacrificial layer 104. The third sacrificial layer 112 may fill the first and the second openings 106 and 108. The first insulation layer 110 may have a thickness of about 50 Å to about 150 Å (for example). The first insulation layer 110 may be formed by a thermal oxidation process (for example). The third sacrificial layer 112 may include silicon nitride (for example). The third sacrificial layer 112 may have a thickness of about 500 Å to about 2,000 Å (for example). The third sacrificial layer 112 may be formed by an LPCVD process and/or a PECVD process (for example). Alternatively, the first insulation layer 110 may be formed using a silicon source gas and an oxygen-containing reaction gas (for example) by a chemical vapor deposition (CVD) process (for example).

Figure 10:
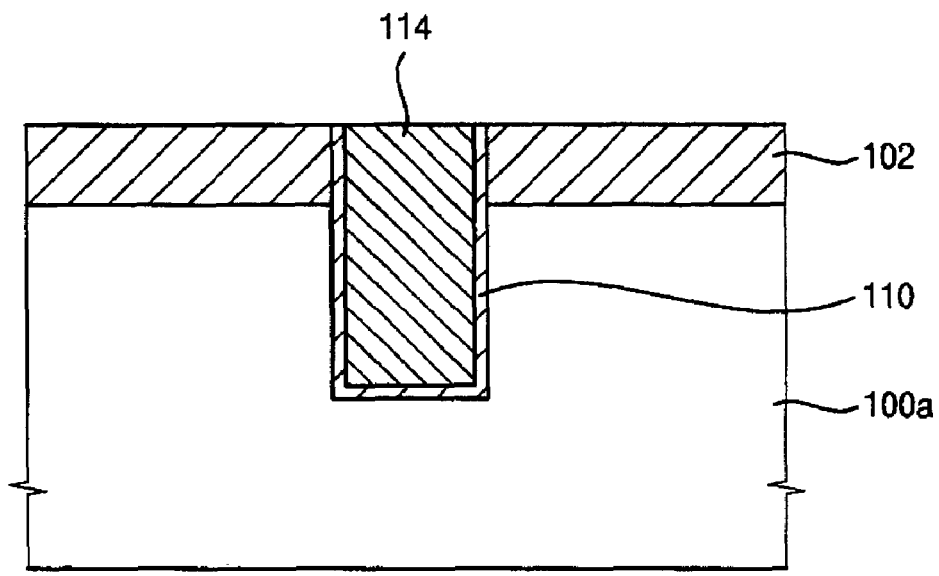

Referring to FIG. 10, an upper portion of the third sacrificial layer 112 and the second sacrificial layer 104 may be removed to form a sacrificial plug 114 in the first and the second openings 106 and 108, respectively. The sacrificial plug 114 may be a portion of the third sacrificial layer 112 that remains after the upper portion of the third sacrificial layer 112 and the second sacrificial layer 104 are removed. For example, the upper portion of the third sacrificial layer 112 and the second sacrificial layer 104 may be planarized by a planarization process such as a chemical mechanical polishing (CMP) process and/or an etch-back process (for example) so that the first sacrificial layer 102 may be exposed to form the sacrificial plug 114 in the first and the second openings 106 and 108, for example. During the planarization process, the first sacrificial layer 102 may serves as a stopping layer.

Figure 11:
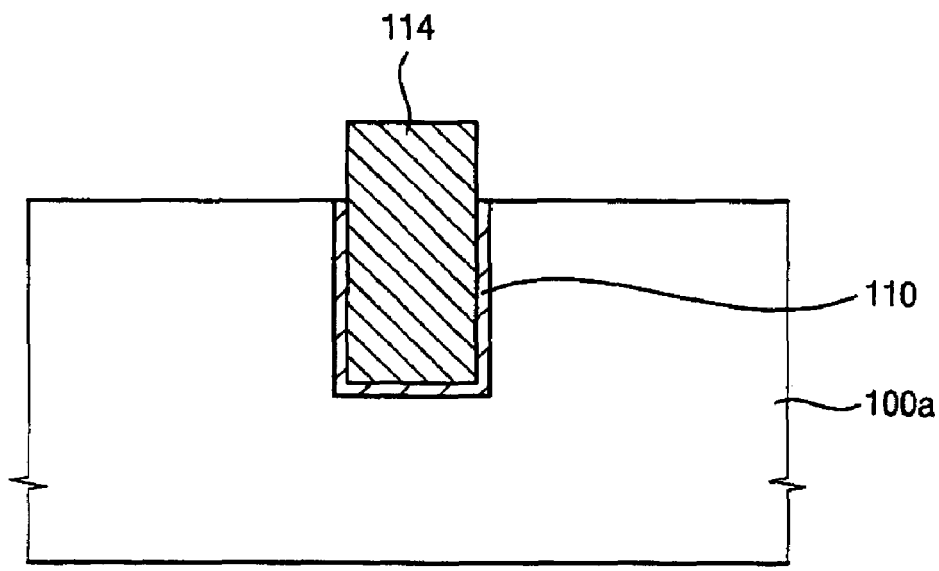

Referring to FIG. 11, the first sacrificial layer 102 may be removed so that the sacrificial plug 114 may protrude from the preliminary semiconductor substrate 100a. For example, the first sacrificial layer 102 may be removed by an isotropic etching process (for example) using an etchant having an etching selectivity between the first sacrificial layer 102 and the sacrificial plug 114. During the isotropic etching process, a portion of the first insulation layer 110, which may be positioned between the first sacrificial layer 102 and the sacrificial plug 114, may be removed. For example, the first sacrificial layer 102 and the portion of the first insulation layer 110 may be removed using a diluted hydrofluoric acid solution (for example) having an etching selectivity between silicon nitride and silicon oxide.

Figure 12:
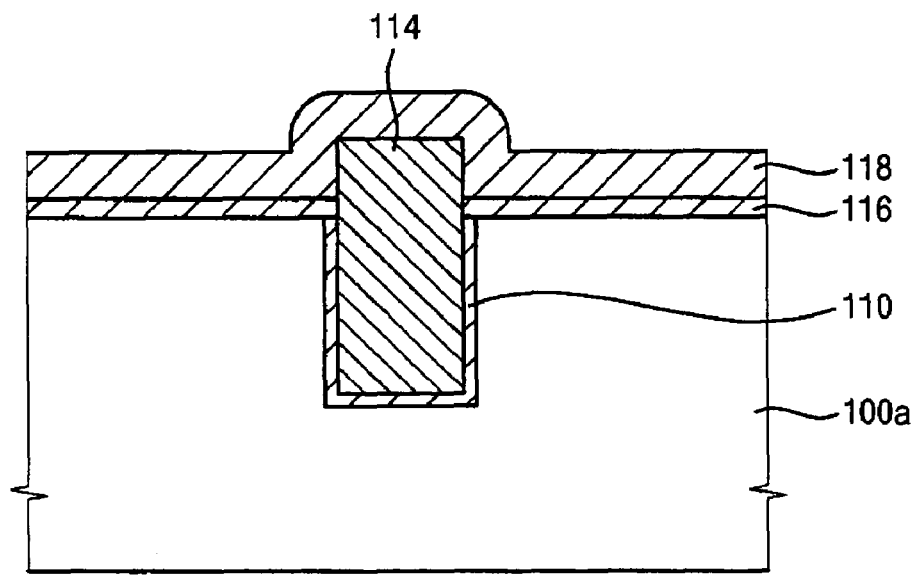

Referring to FIG. 12, a second insulation layer 116 may be formed on the preliminary semiconductor substrate 100a. A fourth sacrificial layer 118 may be formed on the second insulation layer 116, and a portion of the sacrificial plug 114, which may protrude from the preliminary semiconductor substrate 100a. The fourth sacrificial layer 118 may have a uniform thickness. The second insulation layer 116 may include silicon oxide (for example). The second insulation layer 116 may have a thickness of about 100 Å to about 200 Å (for example). The second insulation layer 116 may be formed by a thermal oxidation process (for example). The fourth sacrificial layer 118 may include silicon oxide (for example). The silicon oxide may include USG and/or HDP oxide (for example). These materials may be used alone or in combination. The fourth sacrificial layer 118 may have a thickness of about 300 Å to about 500 Å (for example). A thickness of a channel pattern (see FIG. 1) may be determined in accordance with a thickness of the fourth sacrificial layer 118.

Figure 13:
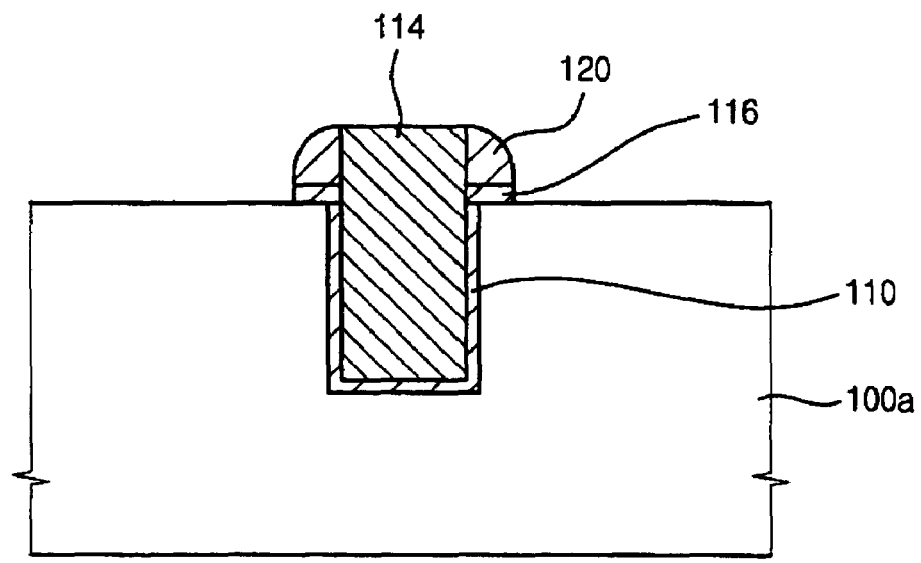

Referring to FIG. 13, the fourth sacrificial layer 118 may be partially removed to form a sacrificial spacer 120. The second insulation layer 116 may be partially removed so that the preliminary semiconductor substrate 100a may be partially exposed. For example, the fourth sacrificial layer 118 may be partially etched by an etch-back process such as a dry etching process (for example) so that the sacrificial plug 114 may be exposed to form the sacrificial spacer 120 on a sidewall of the sacrificial plug 114.

Figure 14:
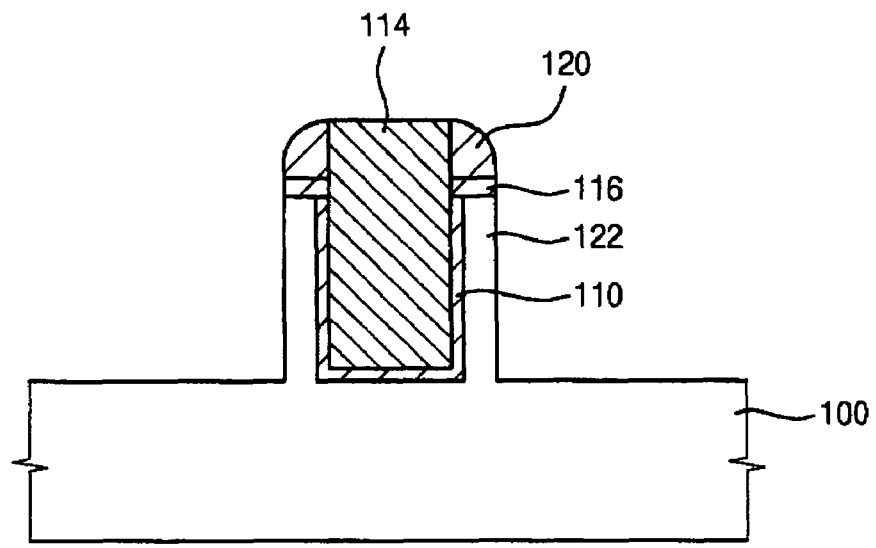

Referring to FIG. 14, the preliminary semiconductor substrate 100a may be anisotropically etched (for example) using the sacrificial spacer 120 and the sacrificial plug 114 as etching masks to form a channel pattern 122 and a semiconductor substrate 100. By way of example only, the channel pattern 122 and the semiconductor substrate 100 may be of an integral, one-piece construction. The channel pattern 122 may have a circular tubular shape and/or a polygonal tubular shape (for example) in accordance with a shape of the sacrificial plug 114. By way of example only, a height of an outer sidewall of the channel pattern 122 (from the substrate 100) may be substantially identical to that of an inner sidewall of the channel pattern 122. When the height of the outer sidewall of the channel pattern 122 is excessively higher than that of the inner sidewall of the channel pattern 122, the channel pattern 122 may not be electrically connected to a conductive region 124 serving as lower source/drain regions, which may be sequentially formed. Accordingly, in forming the channel pattern 122, the preliminary semiconductor substrate 100a may be anisotropically etched to a depth of the second opening 108.

Figure 15:
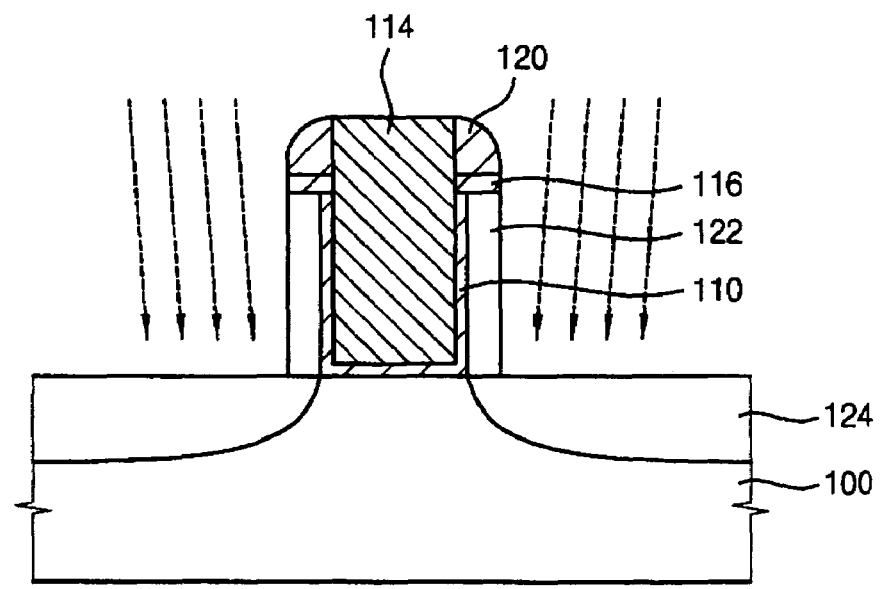

Referring to FIG. 15, a protective layer (not shown) may be formed on the outer sidewall of the channel pattern 122. A preliminary conductive region 124 may be formed on the semiconductor substrate 100. The preliminary conductive region 124 may contact the channel pattern 122. For example, the preliminary conductive region 124 may be formed by an ion implantation process. The preliminary conductive region 124 may serve as the lower source/drain region of the semiconductor device. During the ion implantation process, an ion beam may be irradiated onto the semiconductor substrate 100 in a vertical direction and/or at an incident angle of, for example, about 83° with respect to a surface of the semiconductor substrate 100. In addition, during the ion implantation process the protective layer (not shown) may protect the channel pattern 122. Impurities implanted into the semiconductor substrate 100 may diffuse into a lower portion of the channel pattern 122 by a subsequent thermal treatment process (for example). Thus, the lower portion of the channel pattern 122 may be electrically connected to the preliminary conductive region 124.

The protective layer may include silicon oxide (for example). The protective layer may be formed by a CVD process and/or a thermal oxidation process (for example). The impurities that may be implanted in the substrate 100 may include arsenic (As), phosphorus (P), and boron (B), for example. These impurities may be used alone or in combination.

Figure 16:
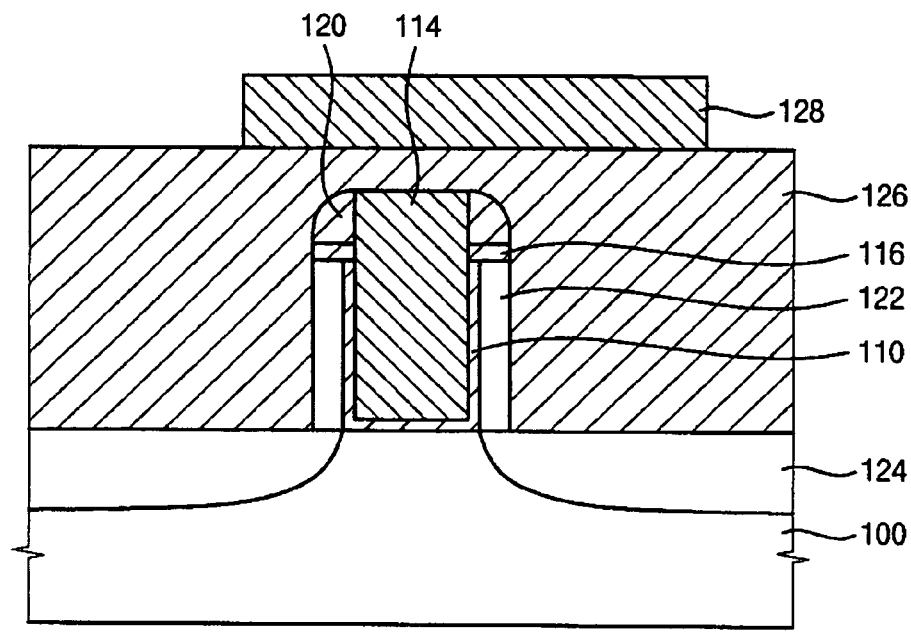

Referring to FIG. 16, a fifth sacrificial layer 126 may be formed on the semiconductor substrate 100 where the channel pattern 122 and the preliminary conductive region 124 may be formed. A hard mask pattern 128, which may partially expose the fifth sacrificial layer 126, may be formed on the fifth sacrificial layer 126. The fifth sacrificial layer 126 may include silicon oxide (for example). The silicon oxide may include USG and HDP oxide, for example. These materials may be used alone or in combination. The fifth sacrificial layer 126 may include a material substantially identical to that of the fourth sacrificial layer 118 (for example). The hard mask pattern 128 may include silicon nitride (for example).

The hard mask pattern 128 may be formed by an LPCVD process (for example). For example, the fifth sacrificial layer 126 may be formed on semiconductor substrate 100 where the channel pattern 122 and the preliminary conductive region 124 may be formed. The fifth sacrificial layer 126 may be planarized by a CMP process (for example). A hard mask layer (not shown) may be formed on the fifth sacrificial layer 126. A second photoresist pattern (not shown) may be formed on the hard mask layer. The hard mask layer may be anisotropically etched using the second photoresist pattern as an etching mask to form the hard mask pattern 128. The second photoresist pattern may be removed by an ashing process and/or a stripping process (for example).

Figure 17:
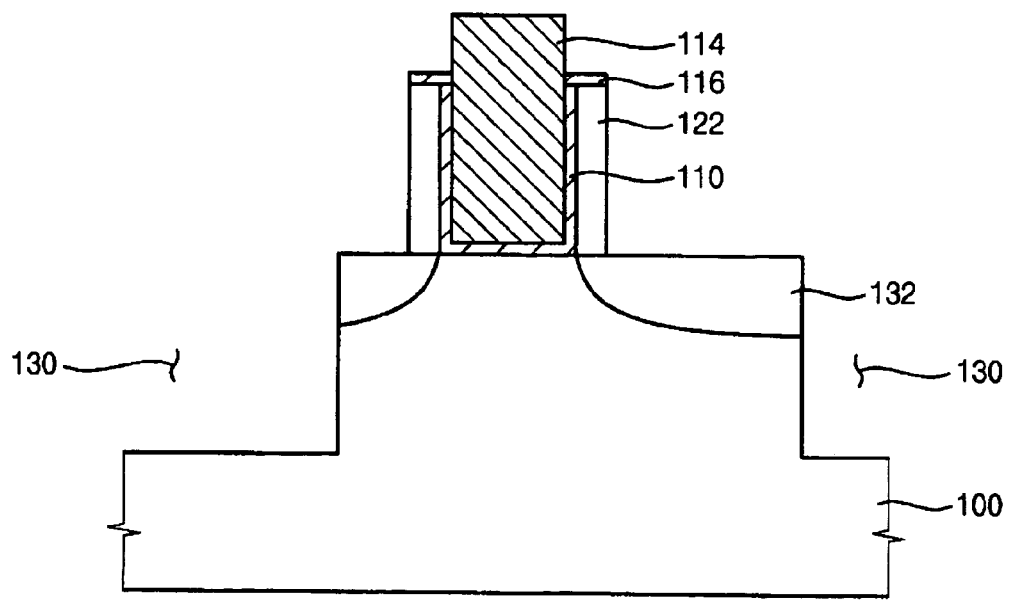

Referring to FIG. 17, the fifth sacrificial layer 126 and an upper portion of the semiconductor substrate 100 may be patterned to form a conductive region 132. The conductive region 132 may be a portion of the preliminary conductive region 124 that may remains after patterning the upper portion of the semiconductor substrate 100. For example, the fifth sacrificial layer 126 and the upper portion of the semiconductor substrate 100 may be partially removed using the hard mask pattern 128 as an etching mask so that a trench 130 may be formed at a surface portion the semiconductor substrate 100. The preliminary conductive region 124 may be partially removed with the upper portion of the semiconductor substrate 100 to form the conductive region 132. The trench 130 may be filled with an isolation layer. The hard mask pattern 128, a portion of the fifth sacrificial layer 126 (which may remain after the fifth sacrificial layer 126 is partially removed), and the sacrificial spacer 120 may be removed. The conductive region 132 may extend in a first direction substantially perpendicular to the channel pattern 122.

Figure 18:
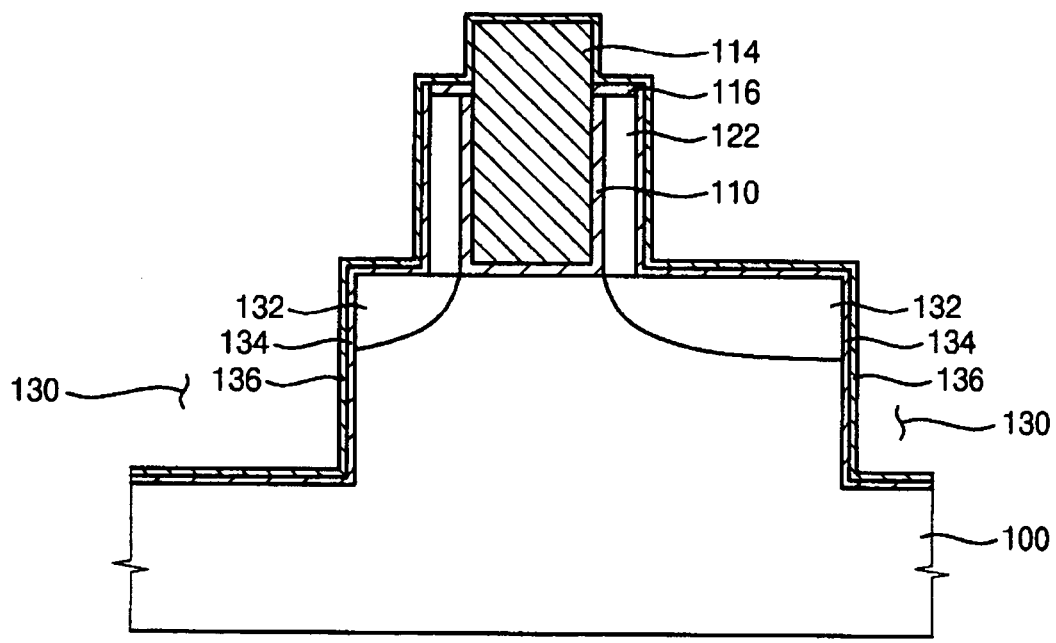

Referring to FIG. 18, an oxide layer 134, which may have a thickness of about 50 Å to about 100 Å (for example), may be formed on the outer sidewall of the channel pattern 122, the conductive region 132, and an inner face of the trench 130 by a thermal oxidation process (for example). The oxide layer 134 may cure damages that may result from a collision between an ion having a high energy and silicon during an etching process for forming the trench 130. The oxide layer 134 may suppress a leakage current.

A nitride layer 136, which may have a thickness of about 50 Å to about 100 Å (for example), may be formed on the oxide layer 134 and a portion of the sacrificial plug 114 that may protrude from the channel pattern 122. The nitride layer 136 may prevent impurities included in a field insulation layer 138 from diffusing into the oxide layer 134 and/or the protruded portion of the sacrificial plug 114.

Figure 19:
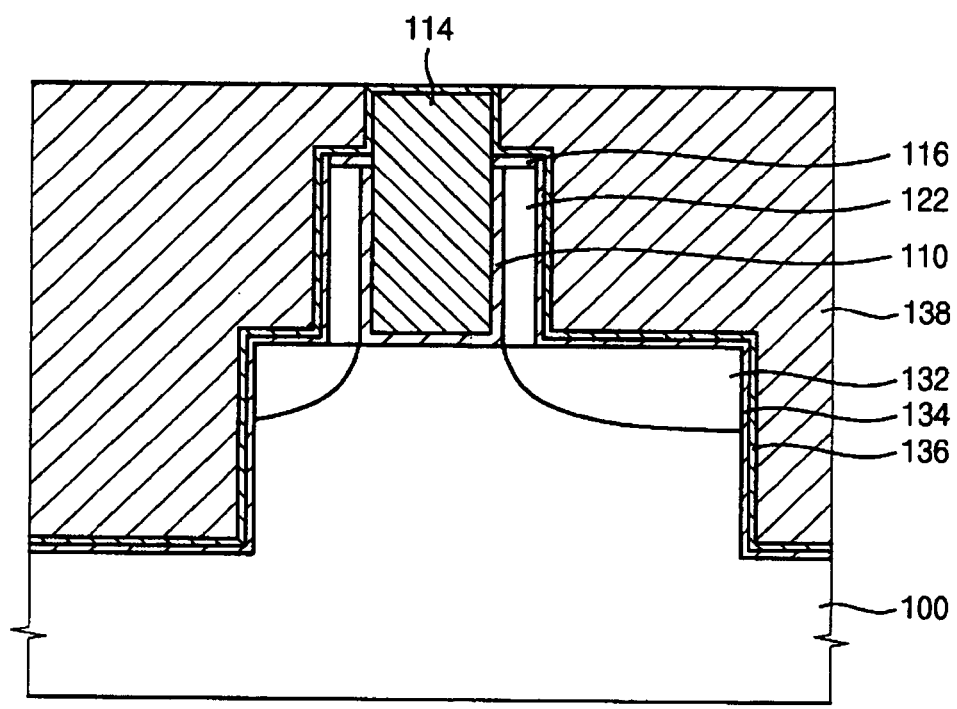

Referring to FIG. 19, the field insulation layer 138 may be formed on the nitride layer 136. The field insulation layer 138 may be planarized. The field insulation layer 138 may include silicon oxide (for example). The silicon oxide may include USG and HDP oxide, for example. These materials may be used alone or in combination. The field insulation layer 138 may be planarized by a CMP process (for example) so that the nitride layer 136 may be exposed.

Figure 20:
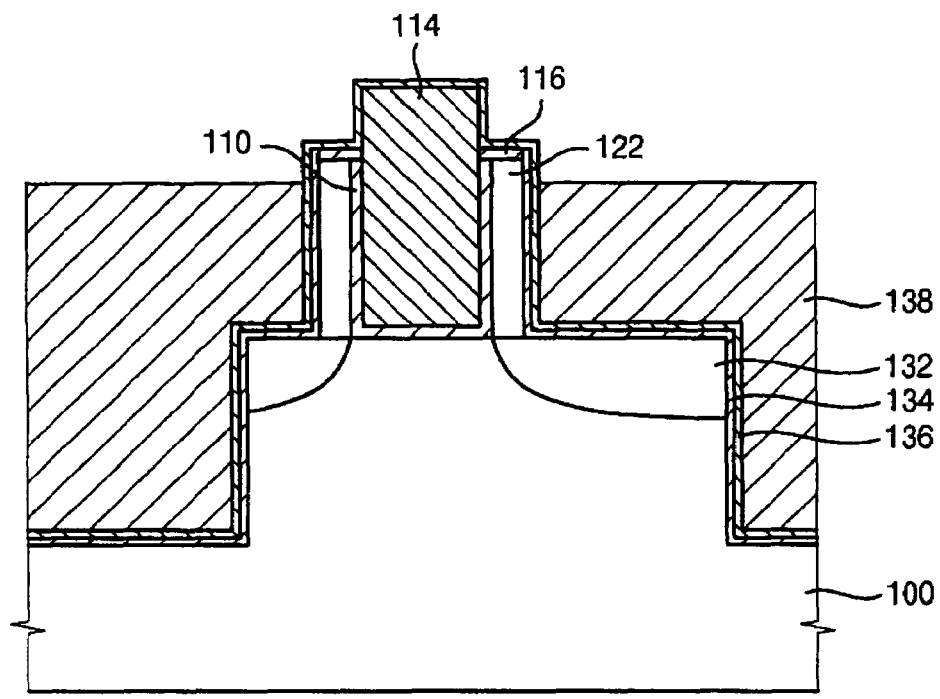

Referring to FIG. 20, the field insulation layer 138 may be partially removed using an etchant (for example) having an etching selectivity between the field insulation layer 138 and the liner nitride layer 136 so that the channel pattern 122 may protrude from the field insulation layer 138. A portion of channel pattern 122, which may protrude from the field insulation layer 138, may have a height of about 100 Å to about 200 Å (for example). For example, the field insulation layer 138 may be partially removed using a diluted hydrofluoric acid solution (for example) having a high etching selectivity between silicon nitride and silicon oxide.

Figure 21:
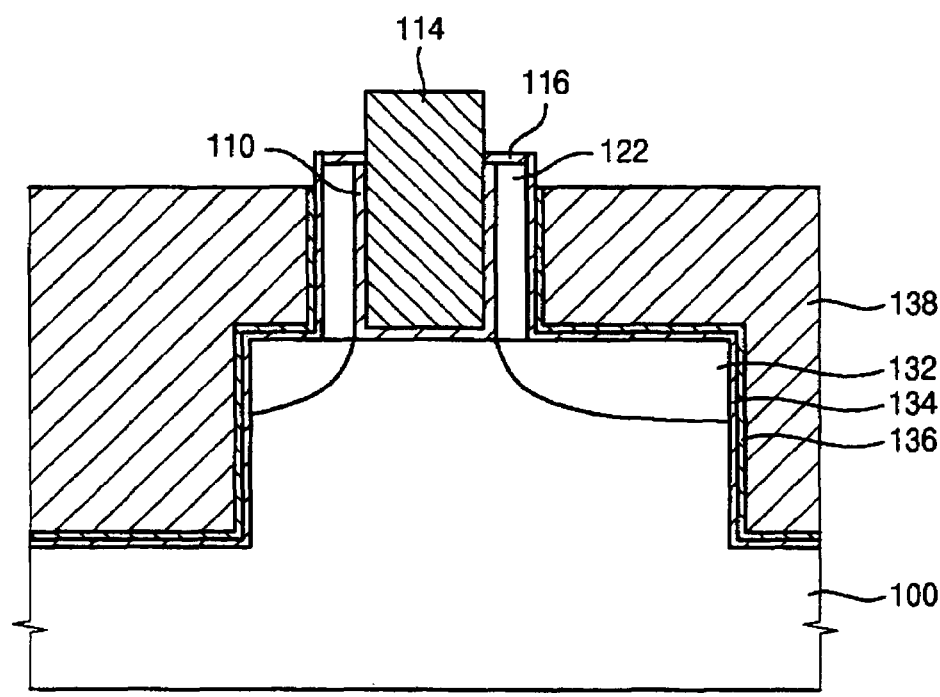

Referring to FIG. 21, a portion of the nitride layer 136, which may be exposed by partially removing the field insulation layer 138, may be removed. For example, the portion of the nitride layer 136 may be removed using an etchant (for example) having an etching selectivity between the field insulation layer 138 and the nitride layer 136. For example, the portion of the nitride layer 136 may be removed using an etchant including phosphoric acid (for example).

Figure 22:
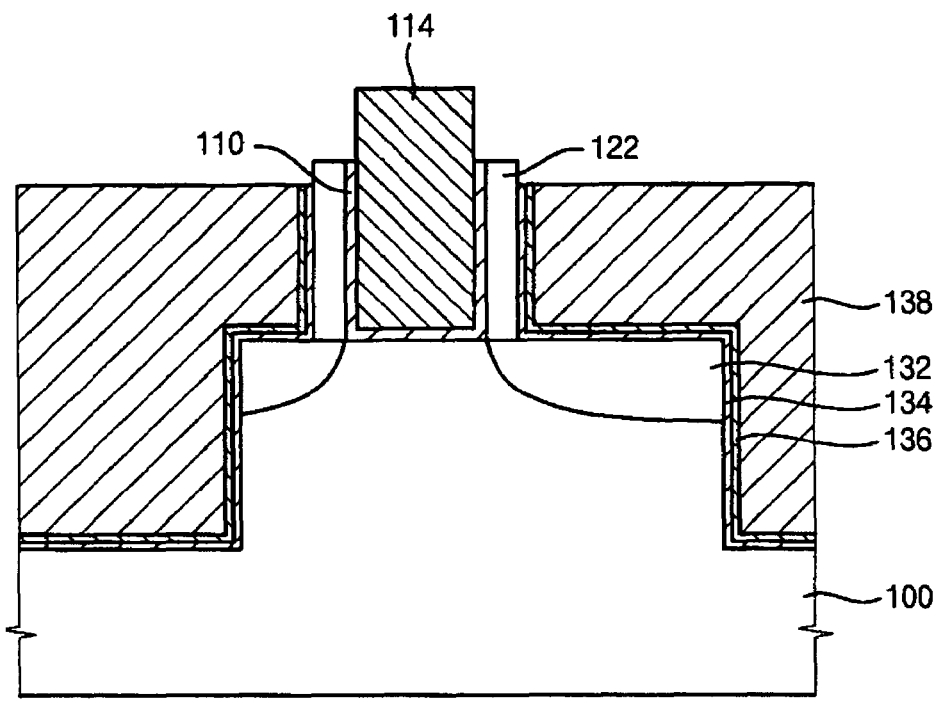

Referring to FIG. 22, portions of the second insulation layer 116 and the oxide layer 134, which may be exposed by removing the portion of the nitride layer 136, may be removed so that the channel pattern 122 may be partially exposed. For example, the portions of the second insulation layer 116 and the oxide layer 134 may be removed using a diluted hydrofluoric acid solution.

Figure 23:
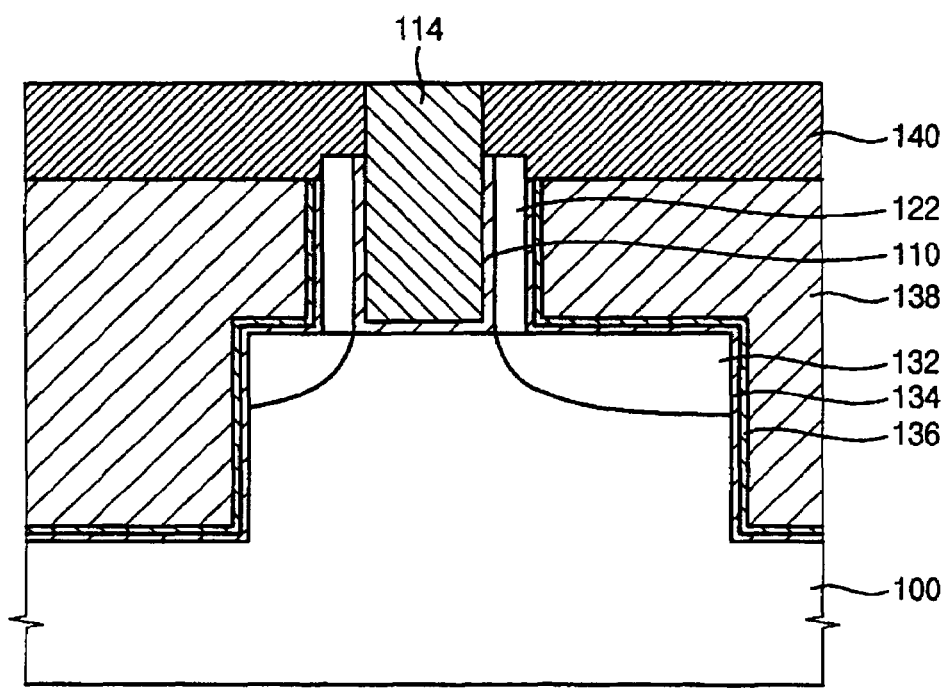

Referring to FIG. 23, a first conductive layer 140 may be formed on the sacrificial plug 114, the channel pattern 122, and the field insulation layer 138. The first conductive layer 140 may be planarized so that the sacrificial plug 114 may be exposed. The first conductive layer 140 may include polysilicon doped with impurities (for example). When the first conductive layer 140 includes polysilicon doped with impurities, the first conductive layer 140 may be formed by an LPCVD process and a doping process (for example). Alternatively, the first conductive layer 140 may include a metal. When the first conductive layer 140 includes a metal, the first conductive layer 140 may be formed by an atomic layer deposition (ALD) process and/or a metal organic chemical vapor deposition (MOCVD) process (for example). The metal may include tungsten (W), titanium (Ti), tantalum (Ta), cobalt (Co), molybdenum (Mo), nickel (Ni), and ruthenium (Ru), for example. These materials may be used alone or in combination. The first conductive layer 140 may be planarized by a CMP process (for example). The sacrificial plug 114 may serve as a stopping layer during the CMP process.

Figure 24:
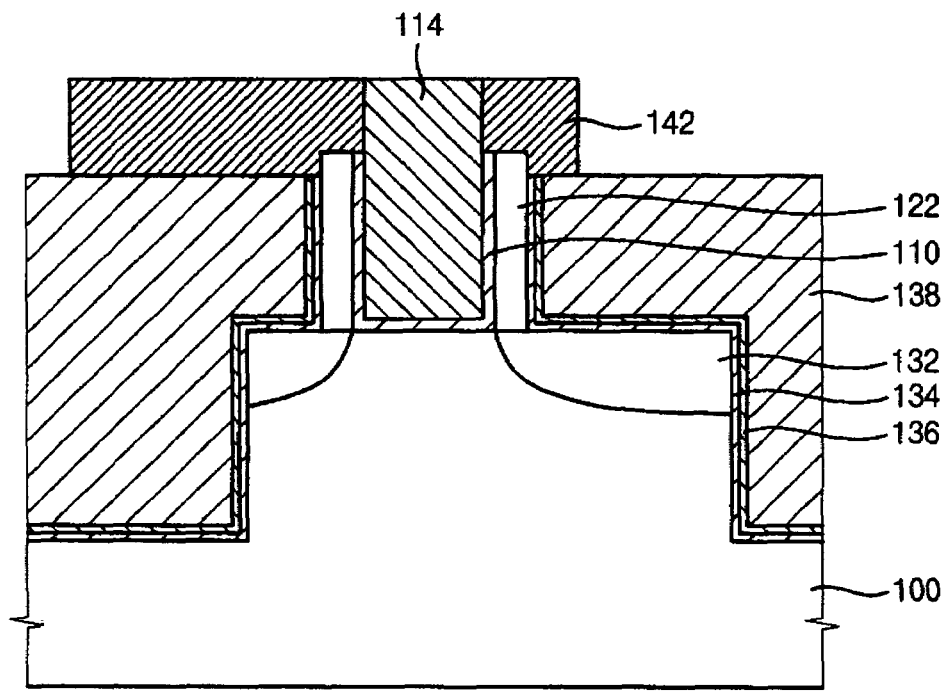

Referring to FIG. 24, the planarized first conductive layer 140 may be patterned to form a preliminary conductive pattern 142 serving as upper source/drain patterns. For example, a third photoresist pattern (not shown) may be formed on the planarized first conductive layer 140. The planarized first conductive layer 140 may be anisotropically etched using the third photoresist pattern as an etching mask to form the preliminary conductive pattern 142.

Figure 25:
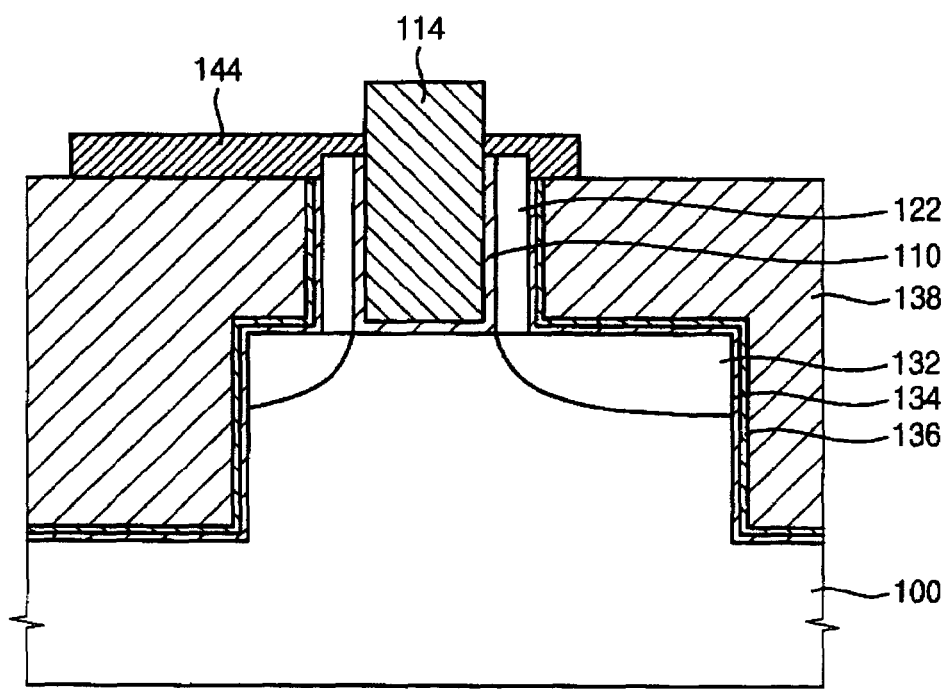

Referring to FIG. 25, the preliminary conductive pattern 142 may be partially removed to form a conductive pattern 144. The conductive pattern 144 may contact the channel pattern 122. The sacrificial plug 114 may protruded from the conductive pattern 144. For example, the preliminary conductive pattern 142 may be partially removed using an etchant (for example) having an etching selectivity between the preliminary conductive pattern 142 and the sacrificial plug 114. The conductive pattern 144 may have a thickness of about 400 Å to about 600 Å (for example). The conductive pattern 144 may enclose an upper portion of the channel pattern 122.

As illustrated in FIG. 25, the conductive pattern 144 and the conductive region 132 may extend from the channel pattern 122 in substantially opposite horizontal directions. Alternatively, the extension direction may be modified. For example, as illustrated in FIG. 3, a conductive pattern 344 may have an extension direction different from that of a conductive region 332. In addition, as illustrated in FIGS. 4 and 5, a conductive pattern 444 may have an extension length shorter than that of a conductive region 432. The conductive pattern 444 may extend in a direction substantially identical to that of the conductive region 432. The conductive pattern 444 and the conductive region 432 may be parallel to each other.

As illustrated in FIG. 25, the conductive pattern 144 may contact the channel pattern 122 and the sacrificial plug 114. Alternatively, the conductive pattern 144 may contact the channel pattern 122 (and not the sacrificial plug 114).

Figure 26:
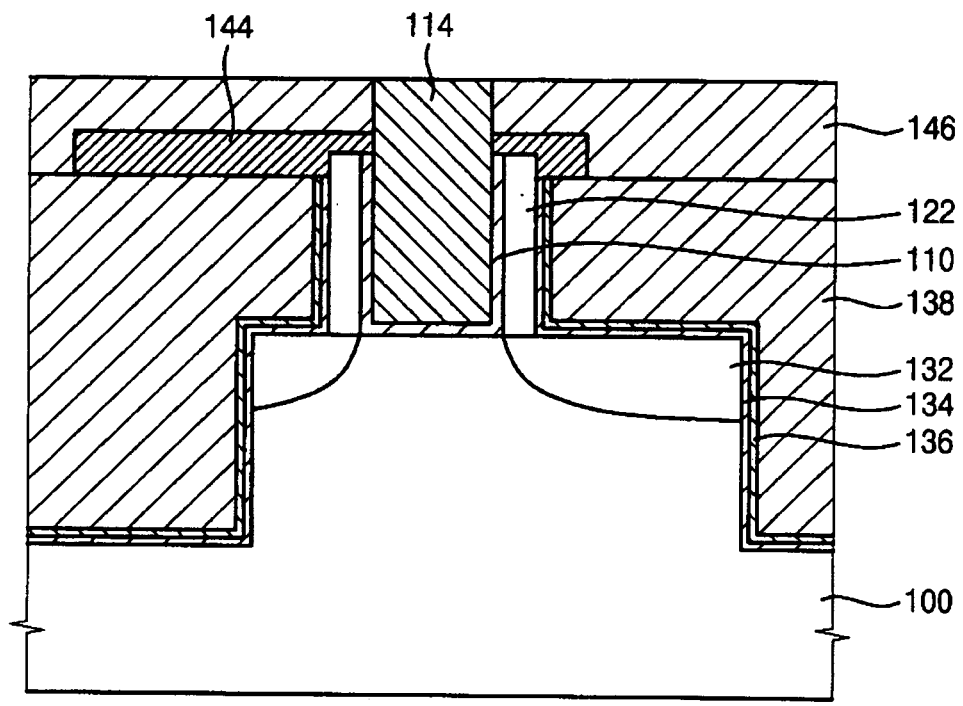

Referring to FIG. 26, a first insulating interlayer 146 may be formed on the conductive pattern 144 and a portion of the sacrificial plug 114 that may protrude from the conductive pattern 144. The first insulating interlayer 146 may be planarized so that the sacrificial plug 114 may exposed. The first insulating interlayer 146 may include silicon oxide (for example). The silicon oxide may include USG and HDP oxide, for example. These materials may be used alone or in combination.

Figure 27:
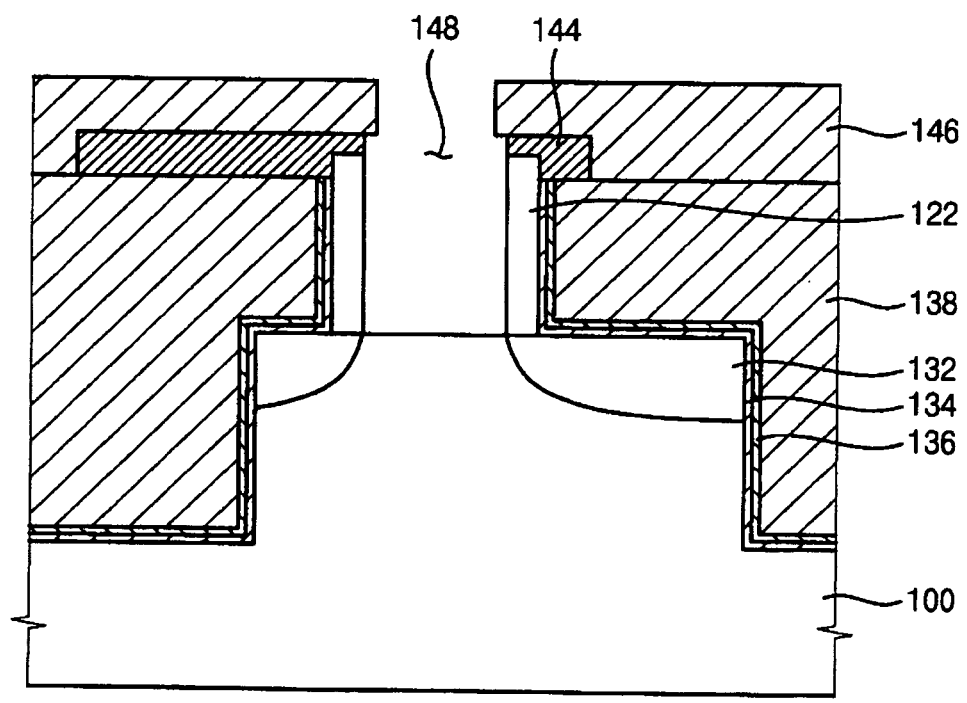

Referring to FIG. 27, the sacrificial plug 114 and the first insulation layer 110 may be removed to form a third opening 148. The third opening 148 may expose the inner sidewall of the channel pattern 122 and also partially expose the semiconductor substrate 100. For example, the sacrificial plug 114 may be removed using an etchant (for example) having an etching selectivity between silicon oxide and silicon nitride. The sacrificial plug 114 may be removed using an etchant including phosphoric acid (for example). The first insulation layer 110 may be removed using an etchant (for example) having an etching selectivity between silicon nitride and silicon oxide. The first insulation layer 110 may be removed using a diluted hydrofluoric acid solution (for example). The conductive pattern 144, which may contact the sacrificial plug 114, may be partially removed when removing the sacrificial plug 114 and the first insulation layer 110.

Figure 28:
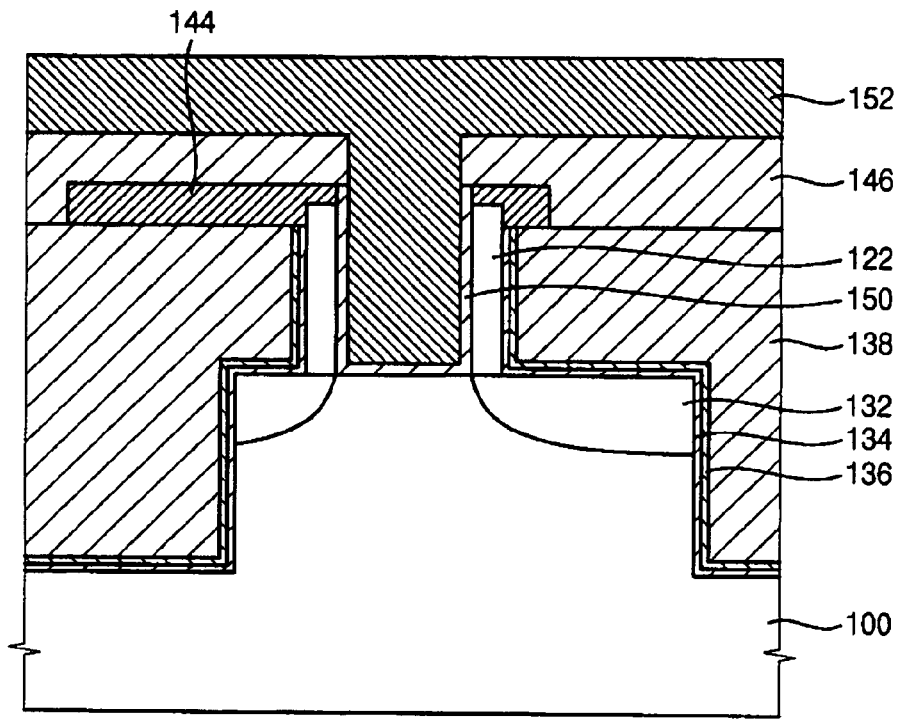

Referring to FIG. 28, a gate insulation layer 150 may be formed on the inner sidewall of the channel pattern 122, a portion of the semiconductor substrate 100, and an inner sidewall of the conductive pattern 144 that may be exposed through the third opening 148. The gate insulation layer 150 may include silicon oxide (for example). When the gate insulation layer 150 includes silicon oxide, the gate insulation layer 150 may be formed by a thermal oxidation process (for example). Alternatively, the gate insulation layer 150 may include a material having a high dielectric constant such as hafnium oxide (HfO2), zirconium oxide (ZrO2), lanthanum oxide (La2O3), tantalum oxide (Ta2O5), titanium oxide (TiO2), strontium titanate (SrTiO3), and barium strontium titanate ((Ba,Sr)TiO3), for example. These materials may be used alone or in combination. When the dielectric layer includes the material having a high dielectric constant, the dielectric layer may be formed by an ALD process and/or an MOCVD process (for example). A surface of the gate insulation layer 150 may be nitrided to form the gate insulation layer 150 including silicon oxynitride.

When the conductive pattern 144 contacts the channel pattern 122 (and not the sacrificial plug 114), the gate insulation layer 150 may be formed on the inner sidewall of the channel pattern 122 and the portion of the semiconductor substrate 100 that may be exposed through the third opening 148. When the gate insulation layer 150 includes the material having a high dielectric constant, the gate insulation layer 150 may be formed by the ALD process and/or the MOCVD process (for example). Thus, the gate insulation layer 150 may be formed on an inner face of the third opening 148 and an inner sidewall of the first insulating interlayer 146.

A second conductive layer 152 may be formed on the inner face of the third opening 148 and the inner sidewall of the first insulating interlayer 146. The second conductive layer 152 may fill the third opening 148. The second conductive layer 152 may be planarized by a CMP process (for example). The second conductive layer 152 may include a metal and/or polysilicon doped with impurities (for example). When the second conductive layer 152 includes polysilicon doped with impurities, the second conductive layer may be formed by an LPCVD process and a doping process (for example). When the second conductive layer includes metal, the second conductive layer 152 may be formed by an ALD process and/or an MOCVD process (for example).

Figure 29:
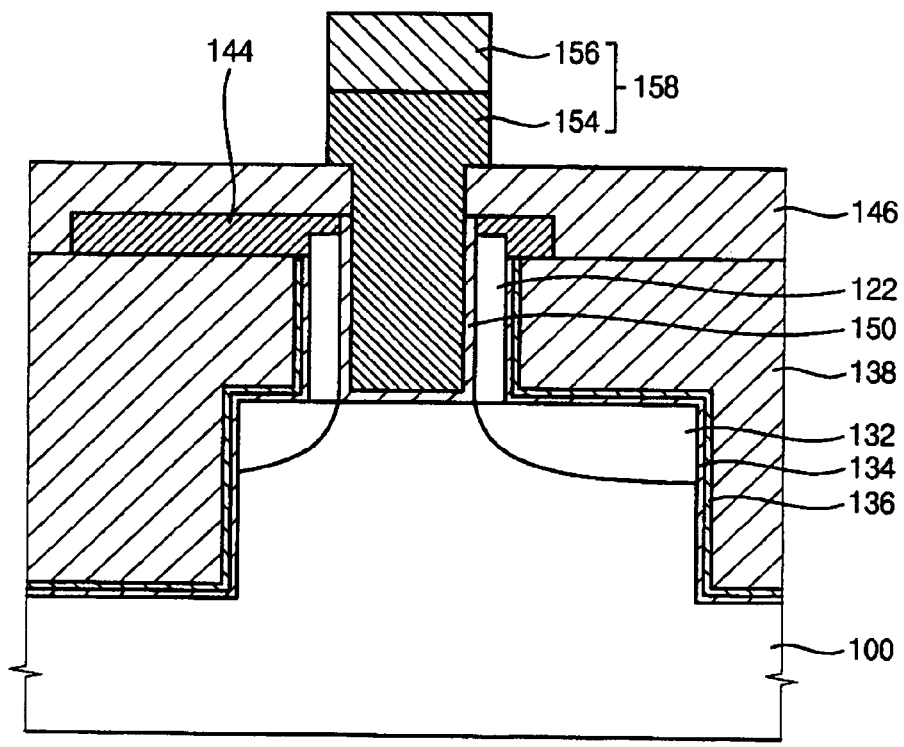

Referring to FIG. 29, a capping layer (not shown) may be formed on the second conductive layer 152. The capping layer and the second conductive layer 152 may be patterned to form a gate structure 158 that may include a gate electrode 154 and a capping pattern 156. The capping layer may include silicon nitride (for example). The capping layer may be formed by an LPCVD process (for example). For example, a fourth photoresist pattern (not shown) may be formed on the capping layer (not shown). The capping layer and the second conductive layer 152 may be anisotropically etched using the fourth photoresist pattern as an etching mask to form the gate structure 158.

Figure 30:
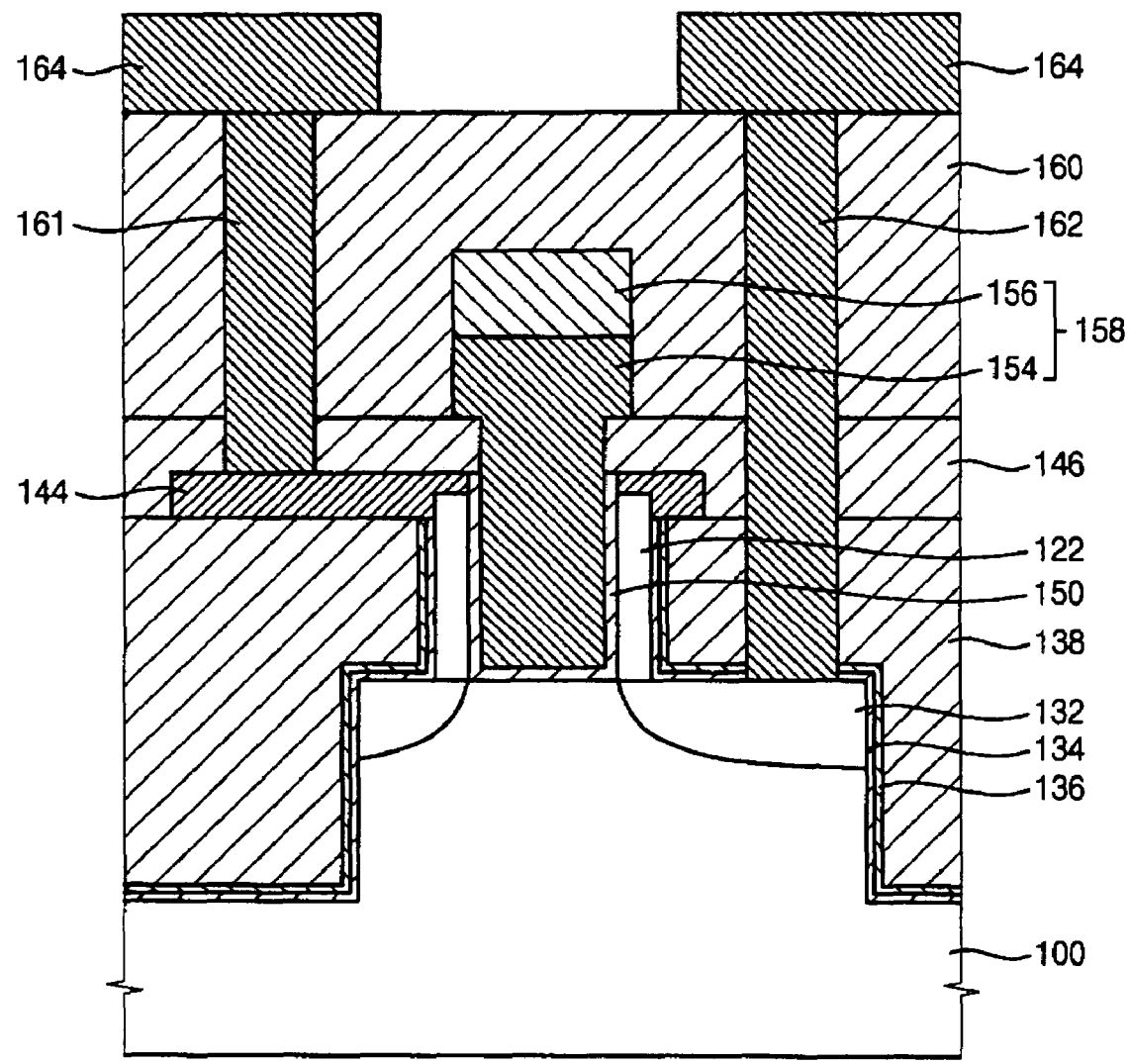

Referring to FIG. 30, a second insulating interlayer 160 may be formed on the gate structure 158 and the first insulating interlayer 146. The second insulating interlayer 160 may be planarized by a CMP process (for example). The second insulating interlayer 160 may include silicon oxide (for example). The silicon oxide may include USG, TEOS and HDP oxide, for example. These materials may be used alone or in combination.

The second insulating interlayer 160 may be partially etched to form a first contact hole and a second contact hole. The first and the second contact holes may expose the conductive pattern 144 and the conductive region 132, respectively. The first and the second contact holes may be formed by a photolithography process and an anisotropic etching process (for example).

A first contact plug 161 and a second contact plug 162 may be formed. The first and the second contact plugs 161 and 162 may fill the first and the second contact holes, respectively.

A metal wire 164 may be formed on the first and the second contact plugs 161 and 162. The metal wire 164 may contact the first and the second contact plugs 161 and 162.

As illustrated in FIG. 30, the first and the second contact plugs 161 and 162 may contact the metal wire 164. In alternative embodiments, any one of the first and the second contact plugs 161 and 162 may contact a capacitor (for example). The semiconductor substrate 100 may be a bulk silicon wafer (for example). In alternative embodiments, the semiconductor substrate 100 may be an SOI substrate (for example).

As illustrated in FIG. 31, a spacer 166, which may include a silicon nitride (for example), may be formed on the gate structure 158. For example, the spacer 166 may be formed on a sidewall of a portion of the gate structure 158 that may protrude into the first insulating interlayer 146. The protruded portion of the gate structure 158 may serve as a word line of the semiconductor device (for example).

Figure 33:
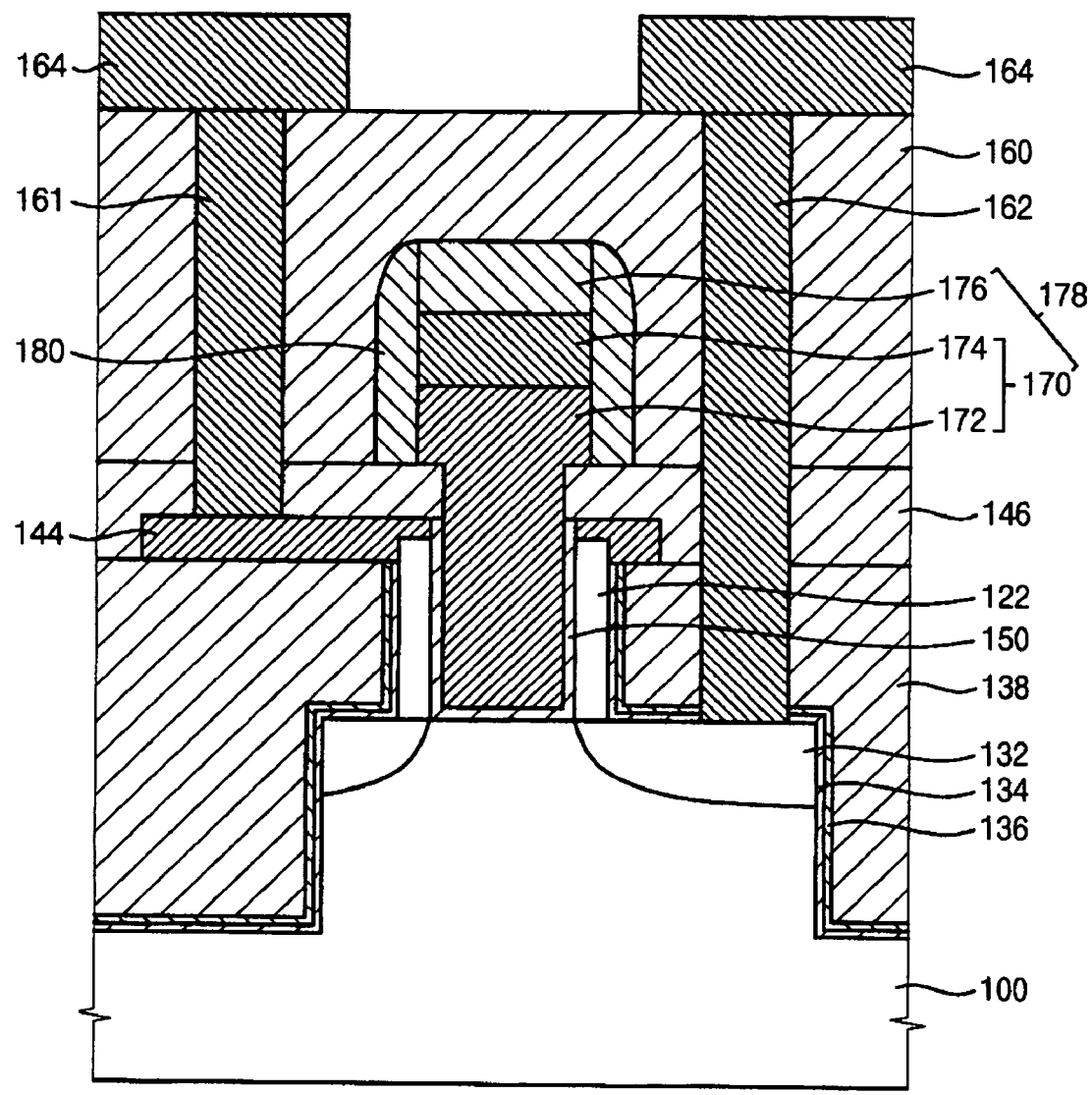

As illustrated in FIG. 32, a gate electrode 170 may include a polysilicon pattern 172 including polysilicon doped with impurities (for example) and a metal silicide pattern 174 formed on the polysilicon pattern 172. For example, a polysilicon layer (not shown) including polysilicon doped with impurities may be formed to fill the third opening 148. The polysilicon layer may be planarized by a CMP process (for example) to form the polysilicon pattern 172. A metal silicide layer (not shown) and a capping layer (not shown) may be formed on the planarized polysilicon layer. The capping layer, the metal silicide layer, and the polysilicon layer may be patterned to form a gate structure 178 including the gate electrode 170 and the capping pattern 176. As illustrated in FIG. 33, a spacer 180 (which may include nitride, for example), may be formed on a sidewall of an upper portion of the gate structure 178 including the gate electrode 170 and the capping pattern 176.

Figure 34:
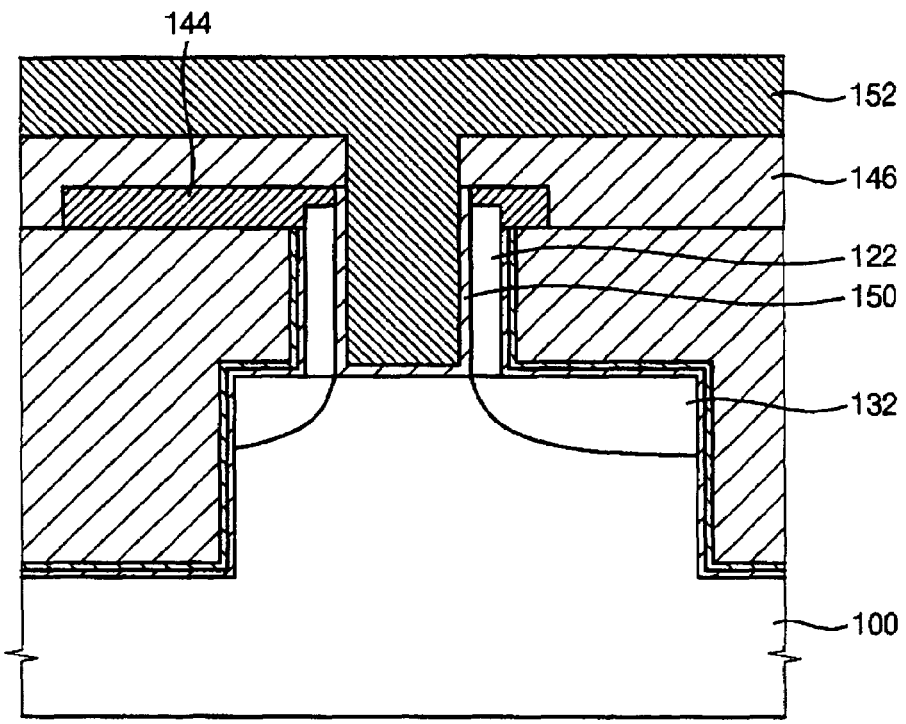
FIGS. 34 to 36 are cross-sectional views illustrating an example, non-limiting method that may be implemented to manufacture a semiconductor device in accordance with another example, non-limiting embodiment of the present invention.
Figure 35:
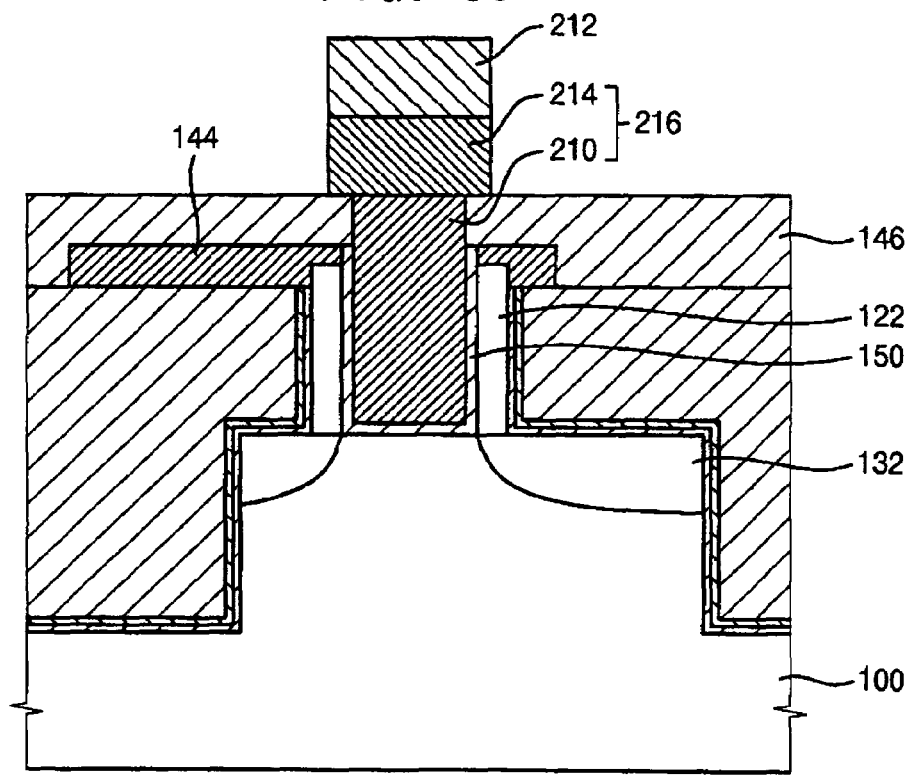

FIGS. 34 to 36 are cross-sectional views illustrating an example method that may be implemented to manufacture a semiconductor device in accordance with another example, non-limiting embodiment of the present invention.

Referring to FIG. 34, a channel pattern 122 may be formed on a semiconductor substrate 100. The channel pattern 122 may have a tubular shape. The channel pattern may vertically extend from the semiconductor substrate 100. A conductive region 132, which may contact the channel pattern 122, may be formed at a surface portion of the semiconductor substrate 100. A conductive pattern 144, which may horizontally extend from an upper portion of the channel pattern 122, may be formed. A first insulating interlayer 146 may be formed on the conductive pattern 144. A gate insulation layer 150 may be formed on an inner face of the channel pattern 122.

A second conductive layer 152 may be formed to fill an inside of the channel pattern 122. The second conductive layer 152 may include polysilicon doped with impurities (for example). The second conductive layer 152 may be formed by an LPCVD process and an impurity doping process (for example).

The above-described elements of the present embodiment may be formed by processes similar to those illustrated with reference to FIGS. 6 to 28. Thus, detailed explanations of the same will be omitted.

Referring to FIG. 35, the second conductive layer 152 may be planarized by a CMP process and/or an etch-back process, for example, so that the first insulating interlayer 146 may be exposed. Thus, a polysilicon plug 210 may extend from a bottom face of the gate insulation layer 150 to a surface of the first insulating interlayer 146. A capping layer (not shown) including silicon nitride (for example) and a third conductive layer (not shown) including metal (for example) may be formed on the polysilicon plug 210 and the first insulating interlayer 146. The capping layer and the third conductive layer may be patterned to form a capping pattern 212 and a metal pattern 214, respectively. In this way, a gate electrode 216 including the polysilicon plug 210 and the metal pattern 214 may be formed.

Referring to FIG. 36, a second insulating interlayer 160 may be formed on the capping pattern 212 and the first insulating interlayer 146. The second insulating interlayer 160 may be planarized by a CMP process (for example). A first contact plug 161 and a second contact plug 162 may be formed to contact the conductive pattern 144 and the conductive region 132, respectively. A metal wire 164 may be formed on the second insulating interlayer 160. The metal wire 164 may contact the first and the second contact plugs 161 and 162.

According to example, non-limiting embodiments of the present invention, a channel pattern (which may have a tubular shape) may vertically extend from a semiconductor substrate. A gate insulation layer may be formed on an inner face of the channel pattern. A gate electrode may vertically extend from a bottom face of the gate insulation layer. A conductive region (which may contact a lower portion of the channel pattern) may serve as lower source/drain regions. A conductive pattern, which may horizontally extend from an upper portion of the channel pattern, may serve as upper source/drain regions.

In a semiconductor device (e.g., a MOS field effect transistor) according to example, non-limiting embodiments of the present invention, a length of a channel may be defined by a height of a channel pattern. A width of the channel may be defined by a width of the channel pattern.

The height and/or the thickness of the channel pattern may be adjusted. Thus, a short channel effect and a narrow channel effect may be suppressed. As a result, a punch-through effect and/or a decrease of a carrier mobility that may caused by the short channel effect may be suppressed. In addition, an increase of a threshold voltage that may be caused by the narrow channel effect may be suppressed.

An efficiency of the semiconductor device may be improved because, for example, the short channel effect and/or the narrow channel may be suppressed in the semiconductor device.

Extension lengths of the conductive pattern and the conductive region, and an angle between extension directions of the conductive pattern and the conductive region may be efficiently adjusted. Thus, a layout of a data storing and/or processing device including the semiconductor device may be improved.

It is to be understood that the invention defined by the appended claims is not to be limited by the particular details set forth in the above description of the example, non-limiting embodiments, as many apparent variations thereof are possible without departing from the spirit or scope thereof as hereinafter claimed.

What is claimed is:

1. A semiconductor device, comprising:
    a tubular channel pattern vertically extending from a semiconductor substrate;
    a gate insulation layer provided on an inner sidewall of the channel pattern and a portion of the semiconductor substrate exposed through the channel pattern so as to form a closed bottom portion;
    a gate electrode provided on the gate insulation layer;
    a conductive region provided at a surface portion of the substrate, the conductive region contacting the channel pattern; and
    a conductive pattern vertically spaced apart from the conductive region and horizontally extending from the channel pattern.

2. The semiconductor device of claim 1, wherein the substrate comprises any one selected from the group consisting of a bulk silicon wafer and a silicon-on-insulator semiconductor substrate.

3. The semiconductor device of claim 1, wherein the gate electrode comprises any one material selected from the group consisting of polysilicon doped with impurities and a metal.

4. The semiconductor device of claim 1, wherein the gate electrode comprises a polysilicon pattern doped with impurities and a metal silicide pattern formed on the polysilicon pattern.

5. The semiconductor device of claim 1, wherein the conductive pattern comprises any one material selected from the group consisting of polysilicon doped with impurities and a metal.

6. The semiconductor device of claim 1, wherein the gate insulation layer comprises at least one material selected from the group consisting of silicon oxide, silicon oxynitride, hafnium oxide, zirconium oxide, lanthanum oxide, tantalum oxide, titanium oxide, strontium titanate and barium strontium titanate.

7. The semiconductor device of claim 1, wherein the gate insulation layer has an upper face higher than that of the channel pattern, and the gate electrode having an upper face higher than that of the gate insulation layer.

8. The semiconductor device of claim 7, wherein the conductive pattern horizontally extends from the gate insulation layer.

9. The semiconductor device of claim 8, further comprising an insulating interlayer provided on the conductive pattern, the insulating interlayer having an upper face lower than that of the gate electrode.

10. The semiconductor device of claim 8, further comprising an insulating interlayer provided on the conductive pattern, wherein the gate electrode comprises a polysilicon plug extending to an upper face of the insulating interlayer and a metal pattern formed on the polysilicon plug.

11. The semiconductor device of claim 1, wherein the conductive region and the conductive pattern extend in horizontal directions substantially different from each other.

12. The semiconductor device of claim 1, wherein the conductive region and the conductive pattern extend in horizontal directions substantially identical to each other, and the conductive region has an extension length longer than that of the conductive pattern.

13. The semiconductor device of claim 1, wherein the channel pattern has a circular tubular shape and the gate electrode has a cylindrical shape.

14. The semiconductor device of claim 1, wherein the conductive pattern encloses a portion of the channel pattern.

15. A method, comprising:
    forming a tubular channel pattern that vertically extends from a substrate;
    forming a conductive region at a surface portion of the substrate, the conductive region contacting the channel pattern;
    forming a conductive pattern that is vertically spaced apart from the conductive region and horizontally extends from the channel pattern;
    forming a gate insulation layer on an inner sidewall of the channel pattern and a portion of the semiconductor substrate exposed through the channel pattern so as to form a closed bottom portion; and
    forming a gate electrode on the gate insulation layer.

16. The method of claim 15, wherein forming the channel pattern comprises:
    forming a sacrificial plug that includes first and second portions, the first portion being protruded from the substrate, and the second portion being buried in the substrate;
    forming a sacrificial spacer on a sidewall of the sacrificial plug; and
    anisotropically etching the substrate using the sacrificial plug and the sacrificial spacer as etching masks to form the channel pattern.

17. The method of claim 16, wherein forming the sacrificial plug comprises:
    forming a first sacrificial layer that includes a first opening partially exposing the substrate;
    anisotropically etching an exposed portion of the substrate to form a second opening exposing the substrate;
    forming a second sacrificial layer on the first sacrificial layer to fill up the first and the second openings;
    partially removing an upper portion of the second sacrificial layer until the first sacrificial layer is exposed; and
    removing the first sacrificial layer.

18. The method of claim 16, wherein forming the conductive region comprises:

implanting impurities into a portion of the substrate adjacent to the channel pattern to form a preliminary conductive region; and patterning the preliminary conductive region.

19. The method of claim 18, wherein the conductive region extends in a first direction and the conductive pattern extends in a second direction substantially different from the first direction.

20. The method of claim 18, wherein the conductive region and the conductive pattern extend in parallel directions substantially identical to each other, and the conductive region has an extension length substantially longer than that of the conductive pattern.

21. The method of claim 16, wherein forming the conductive pattern comprises:

forming an insulation layer on the substrate, the channel pattern being partially protruded from the insulation layer;

forming a conductive layer on the sacrificial plug, the channel pattern and the insulation layer;

planarizing the conductive layer to expose the sacrificial plug;

patterning the planarized conductive layer to form a preliminary conductive pattern; and partially removing the preliminary conductive pattern until a portion of the sacrificial plug protrudes from the conductive pattern.

22. The method of claim 21, wherein the conductive pattern contacts a side face of the sacrificial plug.

23. The method of claim 22, wherein forming the gate insulation layer comprises:

forming an insulating interlayer on the conductive pattern and the sacrificial plug;

planarizing the insulating interlayer until the sacrificial plug is exposed;

removing the sacrificial plug to form an opening exposing the inner sidewall of the channel pattern and the portion of the substrate; and forming the gate insulation layer on the conductive pattern, the inner sidewall of the channel pattern and the portion of the substrate exposed through the opening.

24. The method of claim 23, wherein forming the gate electrode comprises:

forming a second conductive layer on the gate insulation layer and the insulating interlayer to fill the opening; and patterning the conductive layer.

25. The method of claim 23, forming the gate electrode comprises:

forming a polysilicon layer on the gate insulation layer and the insulating interlayer to fill the opening;

forming a metal suicide layer on the polysilicon layer; and patterning the polysilicon layer and the metal suicide layer.

26. The method of claim 23, wherein forming the gate electrode comprises:

forming a polysilicon layer on the gate insulation layer and the insulating interlayer to fill the opening;

removing an upper portion of the polysilicon layer until the insulating interlayer is exposed to form a polysilicon plug in the opening;

forming a metal layer on the polysilicon plug and the insulating interlayer; and patterning the metal layer.

27. A semiconductor device, comprising:

a channel pattern vertically extending from a semiconductor substrate, wherein the channel pattern has a tubular shape;

a gate insulation layer provided on a sidewall of the channel pattern and the semiconductor substrate so as to form a closed bottom portion;

a gate electrode provided on the gate insulation layer;

a conductive region provided at a surface portion of the substrate, the conductive region contacting the channel pattern; and a conductive pattern vertically spaced apart from the conductive region and horizontally extending from the channel pattern.

28. A method, comprising:

forming a channel pattern that vertically extends from a substrate, wherein the channel pattern has a tubular shape;

forming a conductive region at a surface portion of the substrate, the conductive region contacting the channel pattern;

forming a conductive pattern that is vertically spaced apart from the conductive region and horizontally extends from the channel pattern;

forming a gate insulation layer on the channel pattern and the semiconductor substrate so as to form a closed bottom portion; and forming a gate electrode on the gate insulation layer.

* * * * *